(12) United States Patent
Jung et al.

(10) Patent No.: US 7,227,802 B2
(45) Date of Patent: Jun. 5, 2007

(54) MULTI-TIME PROGRAMMABLE SEMICONDUCTOR MEMORY DEVICE AND MULTI-TIME PROGRAMMING METHOD THEREFOR

(75) Inventors: Jong-Hoon Jung, Gyeonggi-do (KR); Gyu-Hong Kim, Gyeonggi-do (KR)

(73) Assignee: Samsung Electronic Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/316,421

(22) Filed: Dec. 21, 2005

(65) Prior Publication Data
US 2006/0152959 A1 Jul. 13, 2006

(30) Foreign Application Priority Data
Dec. 22, 2004 (KR) ............. 10-2004-0110009

(51) Int. Cl.
G11C 17/18 (2006.01)
(52) U.S. Cl. ............. 365/225.7; 365/230.03; 365/230.06; 365/189.08; 365/189.11; 365/96
(58) Field of Classification Search .......... 365/96, 365/163, 225.7, 230.03, 230.06, 189.08, 365/189.11
See application file for complete search history.

(56) References Cited

U.S. PATENT DOCUMENTS

| 5,412,593 | A | * | 5/1995 | Magel et al. .......... 365/96 |
| 5,966,339 | A |   | 10/1999 | Hsu et al. ............ 365/225.7 |
| 6,459,633 | B1 | * | 10/2002 | Jeffery et al. .......... 365/200 |
| 6,477,103 | B1 |   | 11/2002 | Nguyen et al. ......... 365/225.7 |
| 7,084,452 | B2 | * | 8/2006 | Kim ..................... 257/314 |
| 7,136,322 | B2 | * | 11/2006 | Brennan et al. ........ 365/225.7 |

FOREIGN PATENT DOCUMENTS

| JP | 08-148000 | 6/1996 |
| JP | 2000-267846 | 9/2000 |

OTHER PUBLICATIONS

English language abstract of Japanese Publication 08-148000.
English language abstract of Japanese Publication 2000-267846.

* cited by examiner

*Primary Examiner*—Andrew Q. Tran
(74) *Attorney, Agent, or Firm*—Marger Johnson & McCollom, P.C.

(57) ABSTRACT

A multi-time programmable semiconductor memory device includes a unit array, a unit decoder and a cell distribution circuit. The unit array includes a plurality of programmable units, each of which has a plurality of one-time programmable cells. The unit decoder generates a unit select signal for selecting a programmable unit of the unit array based on an address signal. The cell distribution circuit generates an odd-numbered cell programming signal for programming one of odd-numbered one-time programmable cells of the plurality of the one-time programming cells of the programmable unit that is selected by the unit select signal, and an even-numbered cell programming signal for programming one of even-numbered one-time programmable cells of the plurality of the one-time programming cells, based on previous data state of the selected programmable unit received from the unit array, and present data state to be programmed to the selected programmable unit.

34 Claims, 37 Drawing Sheets

23

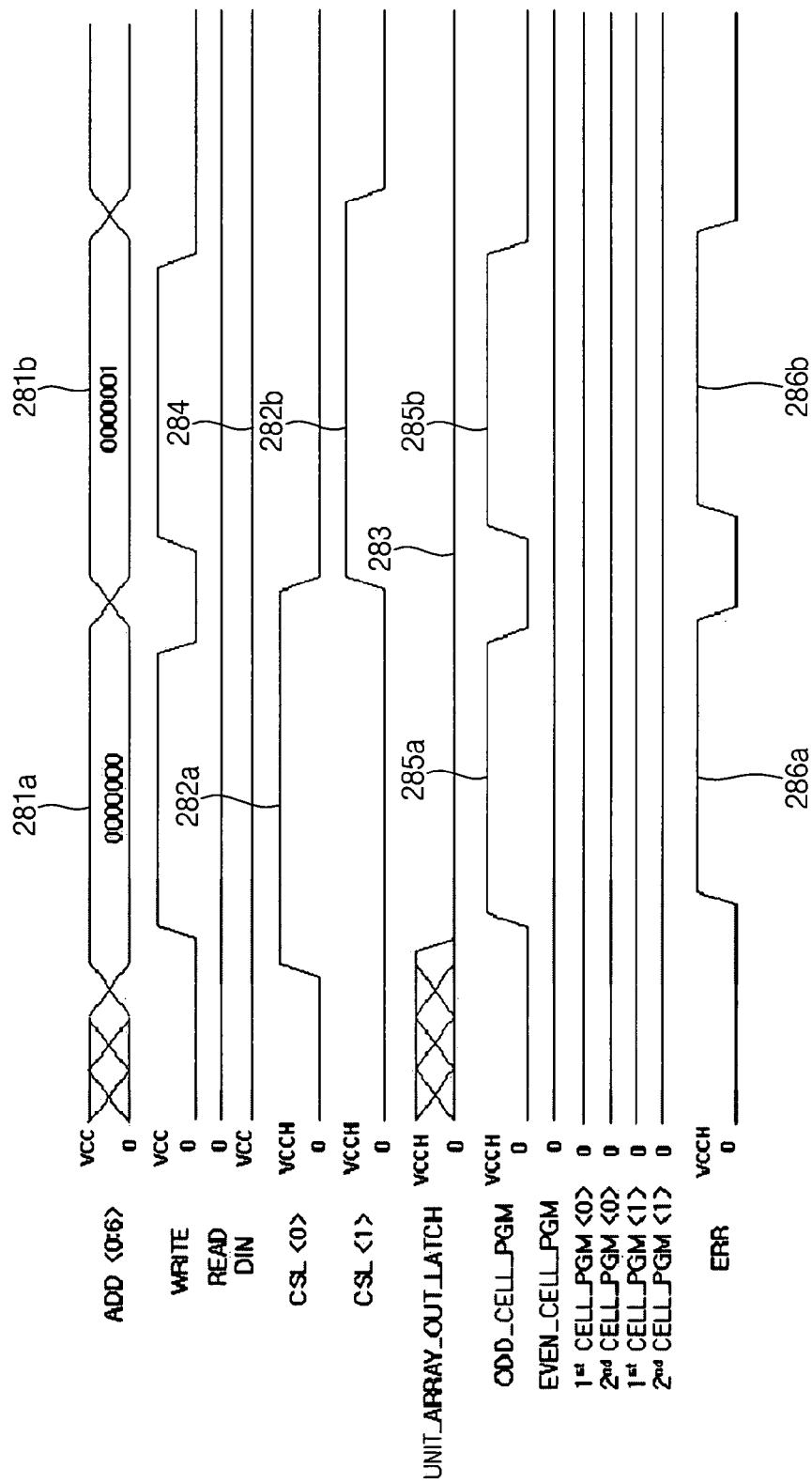

MULTI-TIME PROGRAMMABLE SEMICONDUCTOR MEMORY DEVICE AND MULTI-TIME PROGRAMMING METHOD THEREFOR

CLAIM FOR PRIORITY

This application claims priority under 35 USC § 119 to Korean Patent Application No. 2004-110009, filed on Dec. 22, 2004, the contents of which are herein incorporated by reference in their entirety for all purposes.

BACKGROUND OF THE INVENTION

1. Field of the Invention

The present invention relates to a semiconductor memory device using a one-time programmable device, and more particularly to a multi-time programmable semiconductor memory device, and a multi-time programming method therefor.

2. Description of the Related Art

Non-volatile storing devices may be divided into one-time programmable (referred to as OTP) type devices and multi-time programmable (referred to as MTP) type devices based on the allowable programming frequency. An OTP cell allows for only one programming on an electronic circuit and no additional programming is permissible. The OTP cell may be a fuse, an anti-fuse, an electrically programmable fuse (e-fuse), an erasable programmable read-only memory (EPROM), etc. It is impossible to erase the program stored in the OTP cell without using a separate device. In case of the EPROM, an erase operation may be performed using ultraviolet rays, but a physical auxiliary device is needed for the erase operation and the erase operation cannot be selectively performed at a bit unit level.

Therefore, when using an array of the OTP cells for storing data, additional programming operations are disabled so that once the OTP cell is programmed at either a wafer level or an end user level, updating data is impossible. Thus, when stored data needs to be updated, the use of the MTP cell is inevitable despite the advantages of OTP cells, such as lower cost, logic compatibility, etc.

The non-volatile MTP cells include a variety of types such as an electrically erasable programmable ROM (EEPROM), a ferroelectric random-access memory (FRAM), a magnetic RAM (MRAM), a phase-change RAM (PRAM), etc. However, despite the fact that multi-time programming may be feasible within the endurance limits of the MTP cell, the MTP cell has a complex structure and higher manufacturing costs due to an additional separate mask. Therefore, in some applications where a relatively low amount of data is to be stored, the MTP cells may result in the loss of competitive advantage in the marketplace for manufacturers and providers.

U.S. Pat. No. 5,966,339 assigned to International Business Machines Corp., discloses a multi-time programmable semiconductor memory device using a fuse cell. A unit includes a plurality of fuse cells to store a data bit, and an XOR operation is performed on states of the fuse cells for use in updating data.

According to U.S. Pat. No. 5,966,339, when the unit is programmed, the fuse cells included in the unit are sequentially programmed so that when an additional programming operation is performed on the fuse cell, the data in the unit is repeatedly updated.

FIG. 1 is a block diagram illustrating a conventional multi-stage reprogrammable fuse logic, which is described in the above U.S. Pat. No. 5,966,339.

Referring to FIG. 1, the conventional multi-stage reprogrammable fuse logic includes four fuses: FUSE A, FUSE B, FUSE C, and FUSE D respectively having inputs P1, P2, P3, and P4. The first two fuses, i.e., FUSE A and FUSE B, are connected to each other by way of an exclusive OR circuit. An output Y1 of the exclusive OR circuit is combined by the fuse FUSE C by way of an exclusive OR circuit. In a similar manner, the reprogrammable fuse in FIG. 1 may be repeatedly programmed.

However, according to U.S. Pat. No. 5,966,339, the following technical problems remain.

First, in order to update data stored in the unit, the stored data needs to be known to an external device. The data stored in the respective units are transmitted to an external device and compared with a new data that is to be written to the unit. Therefore, an additional device is needed to perform the above operation.

Secondly, when the data currently stored in the unit is to be updated, a fuse among a plurality of fuses in the unit, of which is to be programmed, cannot automatically be known. Therefore, over-programming, in which a fuse may be programmed over twice, or simultaneous programming, in which at least two fuses in the same unit are simultaneously programmed, may occur. Particularly, the electrically-programmed fuse is generally implemented using a polysilicon fuse, which is cut by allowing a strong current pulse to flow, exceeding a threshold value during a programming operation. Therefore, compared with a laser-blown fuse, there are few differences between the programmed state and a non-programmed state. In addition, the endurance of each state may be so poor that over-programming may occur.

Therefore, to program a desired fuse in the selected unit, the programming state of the respective fuses in the selected unit needs to be checked. Accordingly, there exists a need for a device that provides each programming state of the fuse in either serial or parallel to an external device. Employing such a device may require a plurality of pads or registers according to the number of fuses included in the unit, and is thus disadvantageous in view of chip area.

Third, in order to sequentially program one fuse at a time, a decoding circuit is needed to select a fuse among a plurality of fuses in the unit. The use of the decoding circuit may require an additional address pad, register, etc., and is thus disadvantageous in view of chip area.

Fourth, to disallow any additional programming when all the fuses in the unit are programmed, an external device needs to be notified of the programming state.

Fifth, when the unit is programmed and additional programming commands for writing different data is received by the unit, a device for preventing the additional programming, or for indicating to an external device the input of additional programming commands, is needed.

SUMMARY OF THE INVENTION

Accordingly, the present invention is provided to substantially obviate one or more problems due to limitations and disadvantages of the related art.

Embodiments of the present invention may provide a multi-time programmable semiconductor memory device, in which a multi-time programming operation may be performed on the semiconductor memory device by using a programmable unit having a plurality of OTP cells. In addition, a method of multi-time programming of a multi-time programmable semiconductor memory device is provided.

In one embodiment of the present invention, a multi-time programmable semiconductor memory device includes a unit array, a unit decoder and a cell distribution circuit. The unit array includes a plurality of programmable units, each of which has a plurality of one-time programmable cells. The unit decoder generates a unit select signal for selecting a programmable unit of the unit array based on an address signal. The cell distribution circuit generates an odd-numbered cell programming signal for programming one of odd-numbered one-time programmable cells of the plurality of the one-time programming cells of the programmable unit that is selected by the unit select signal, and an even-numbered cell programming signal for programming one of even-numbered one-time programmable cells of the plurality of the one-time programming cells, based on first data written in the selected programmable unit received from the unit array and second data to be written to the selected programmable unit.

BRIEF DESCRIPTION OF THE DRAWINGS

The present invention will become more apparent to those of ordinary skill in the art by describing, in detail, example embodiments thereof with reference to the attached drawings, wherein like elements are represented by like reference numerals, which are given by way of illustration only and thus do not limit the example embodiments of the present invention.

FIGS. 24A through 24E are timing diagrams illustrating a write operation of a multi-time programmable semiconductor memory device that may be programmed at least twice according to an embodiment of the present invention.

DESCRIPTION OF THE EXAMPLE EMBODIMENTS

Hereinafter, the present invention will be explained in detail with reference to the accompanying drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
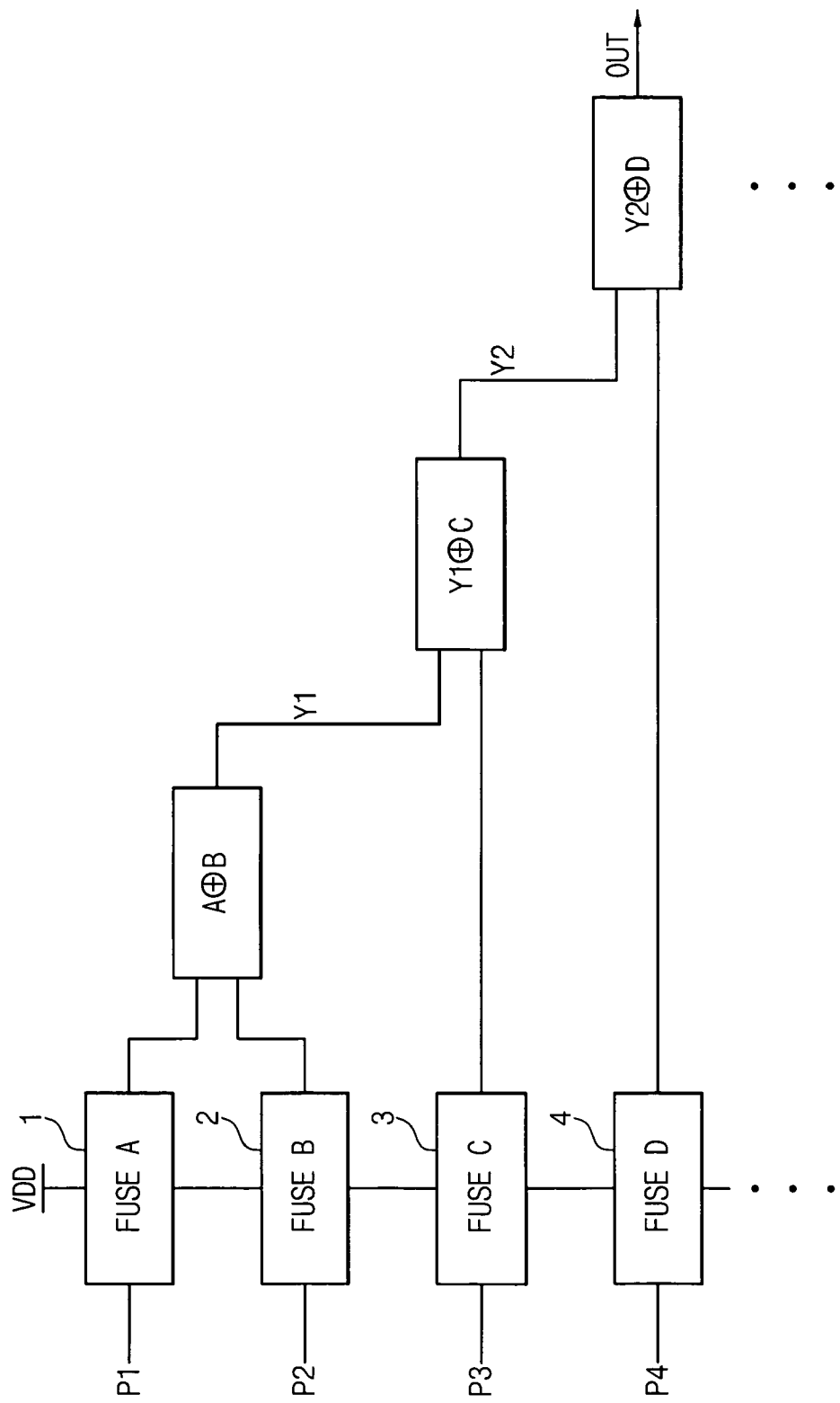
FIG. 1 is a block diagram illustrating a conventional multi-stage reprogrammable fuse arrangement.
Figure 2:
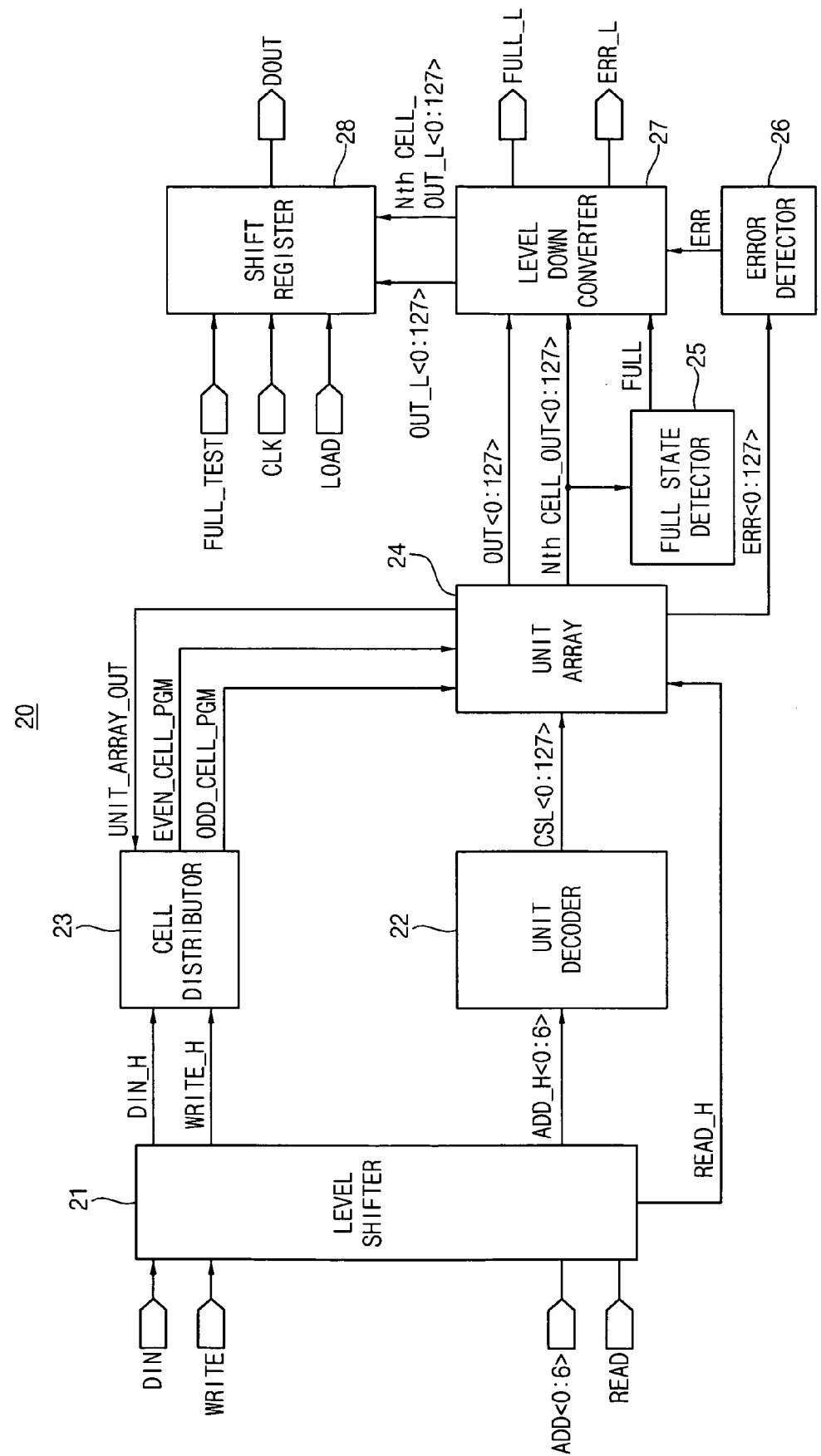
FIG. 2 is a block diagram illustrating a multi-time programmable semiconductor memory device according to an embodiment of the present invention.

FIG. 2 is a block diagram illustrating a multi-time programmable semiconductor memory device 20 according to an embodiment of the present invention.

Referring to FIG. 2, the multi-time programmable semiconductor memory device 20 may include a unit decoder 22, a cell distributor 23 and a unit array 24.

In addition, the multi-time programmable semiconductor memory device 20 may further include a full state detector 25, an error detector 26, and a shift register circuit 28.

In addition, the multi-time programmable semiconductor memory device 20 may further include a level shifter 21, and a level down converter 27.

The level shifter 21 converts an input signal externally provided to an internal signal in accordance with an internal operating voltage of the multi-time programmable semiconductor memory device 20. For example, the input signal may have a voltage level of about 1.2V and the internal signal may have a voltage level of about 3.3V.

The level shifter 21 receives an data input signal DIN, a write input signal WRITE, an address input signal ADD<0: 6>, and a read input signal READ from an external device to convert the respective received signals to internal signals for the multi-time programmable semiconductor memory device, namely a data signal DIN_H, a write signal WRITE_H, an address signal ADD_H<0:6>, and a read signal READ_H.

In FIG. 2, the address input signal ADD<0:6> and the address signal ADD_H<0:6> respectively have 7 bits so that a total of 128 programmable units of the unit array 24 may be accessed. It is noted that the bit number of the address signal and the number of the programmable units in the unit array 24 may vary in different embodiments.

The unit decoder 22 decodes the address signal ADD_H<0:6> to generate a unit select signal CSL<0:127> for selecting a programmable unit designated by the address signal ADD_H<0:6> among 128 programmable units of the unit array 24.

The unit array 24 includes 128 programmable units. The respective programmable units of the unit array 24 include a plurality of OTP cells. Each programmable unit is used to store one-bit of information.

The unit array 24 receives the unit select signal CSL<0: 127> for determining which programmable unit of the unit array 24 is selected and in a write operation, the unit array 24 receives an odd-numbered cell programming signal ODD_CELL_PGM and an even-numbered cell programming signal EVEN_CELL_PGM for determining which OTP cell is selected from the plurality of the OTP cells of the programmable unit.

The unit array 24 outputs a unit output signal OUT<0: 127> for outputting a value stored in the respective programmable unit and a unit full state signal Nth CELL_OUT<0:127> that indicates whether all the OTP cells in the respective programmable units are programmed. The unit full state signal Nth CELL_OUT<0:127> may indicate a programming state of the last OTP cell of the programmable unit.

In addition, in the write operation, the unit array 24 outputs a unit error state signal ERR<0:127> that indicates whether the selected programmable unit has an error. In addition, the unit array 24 feeds back a unit output signal UNIT_ARRAY_OUT, separate from the unit output signal OUT<0:127>, to the cell distributor 23.

The cell distributor 23 outputs the odd-numbered cell programming signal ODD_CELL_PGM and the even-numbered cell programming signal EVEN_CELL_PGM based on the data signal DIN_H, the write signal WRITE_H, and the unit array output signal UNIT_ARRAY_OUT.

Namely, the cell distributor 23 determines whether odd-numbered OTP cells are to be programmed or even-numbered OTP cells are to be programmed among the plurality of the OTP cells of the respective programmable units based on a logical combination of the data signal DIN_H, the write signal WRITE_H, and the unit array output signal UNIT_ARRAY_OUT. The reason for the feedback of the unit array output signal UNIT_ARRAY_OUT outputted from the unit array 24 is that data currently written in the selected programmable unit has an influence on determining which OTP cell is to be programmed among the plurality of the OTP cells in the selected programmable unit.

The full state detector 25 outputs a full state signal FULL based on the unit full state signal Nth CELL_OUT<0: 127>outputted from the 128 programmable units in the unit array 24.

The error detector 26 outputs an error state signal ERR based on the unit error state signal ERR<0:127> outputted from the 128 programmable units in the unit array 24.

The level down converter 27 converts the internal signals of the multi-time programmable semiconductor memory device 20 into an external signal in accordance with an external operating voltage of the multi-time programmable semiconductor memory device 20. Namely, the level down converter 27 performs an opposite operation of the level shifter 21. For example, the level down converter 27 may convert the internal signals having a voltage level of about 3.3V to the external operating voltage signal having a voltage level of about 1.2V.

In a read operation, the shift register circuit 28 serially outputs 128-bit data provided from the unit array 24 to an output data pad DOUT based on a load signal LOAD and a clock signal CLK. The 128-bit data outputted from the unit array 24 may correspond to an external unit output signal OUT_L<0:127> or an external unit full state signal Nth CELL_OUT_L<0:127> that are converted by the level down converter 27.

A full state test signal FULL_TEST provided to the shift register circuit 28 is used to determine which one of the external unit output signal OUT_L<0:127> and the external unit full state signal Nth CELL_OUT_L<0:127> is to be outputted.

The operation and structure of the respective elements in FIG. 2 will be described later in more detail.

Figure 3:
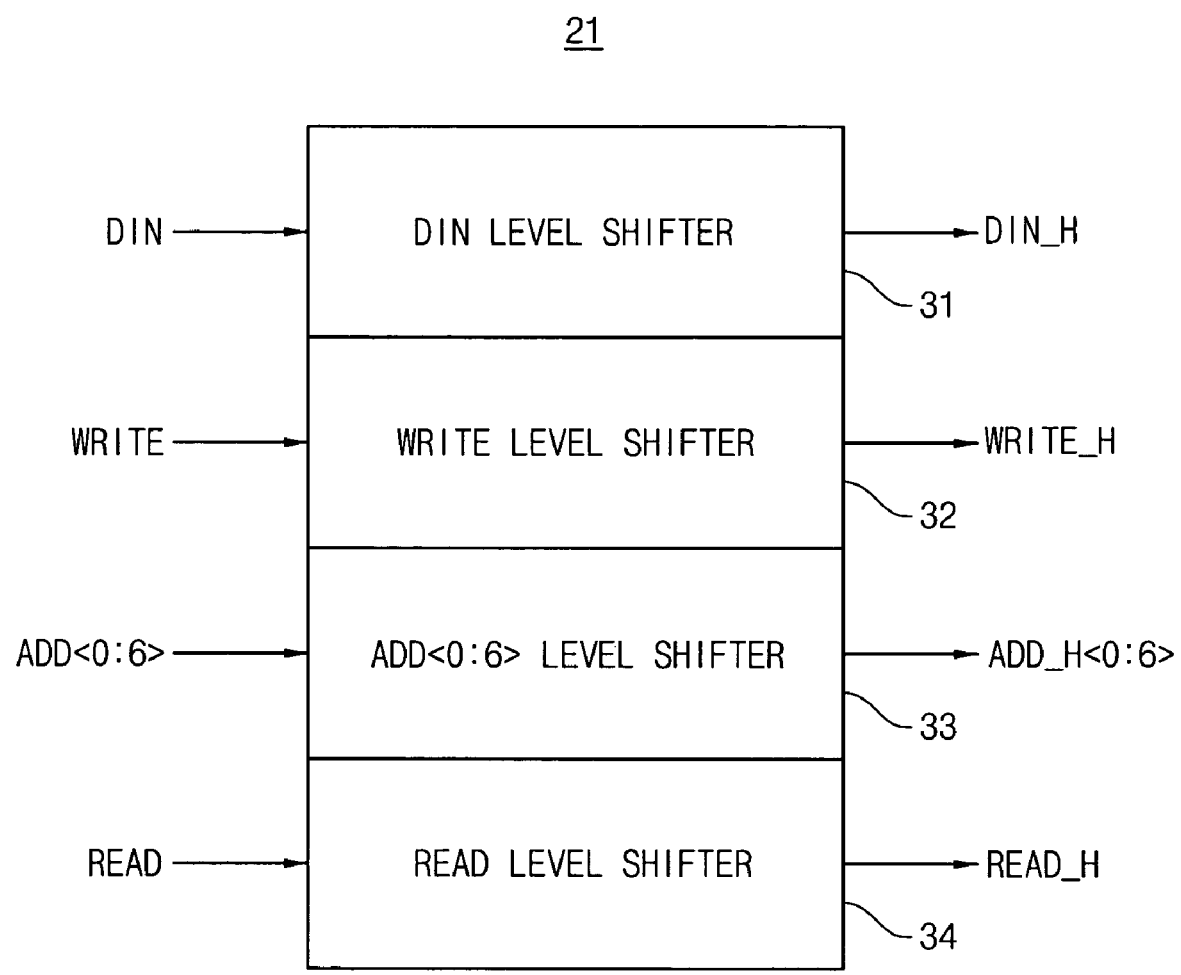
FIG. 3 is a block diagram illustrating a level shifter circuit of a multi-time programmable semiconductor memory device according to an embodiment of the present invention.

FIG. 3 is a block diagram illustrating a level shifter circuit 21 of a multi-time programmable semiconductor memory device according to an embodiment of the present invention.

Referring to FIG. 3, the level shifter 21 includes a data input level shifter DIN LEVEL SHIFTER 31, a write signal level shifter WRITE LEVEL SHIFTER 32, an address signal level shifter ADD<0:6> LEVEL SHIFTER 33, and a read signal level shifter READ LEVEL SHIFTER 34.

The level shifters 31, 32, 33, and 34 respectively convert the data input signal DIN, the write input signal WRITE, the address input signal ADD<0:6>, and the read input signal READ received from an external device to the data signal DIN_H, the write signal WRITE_H, the address signal ADD_H<0:6>, and the read signal READ_H.

Figure 4:
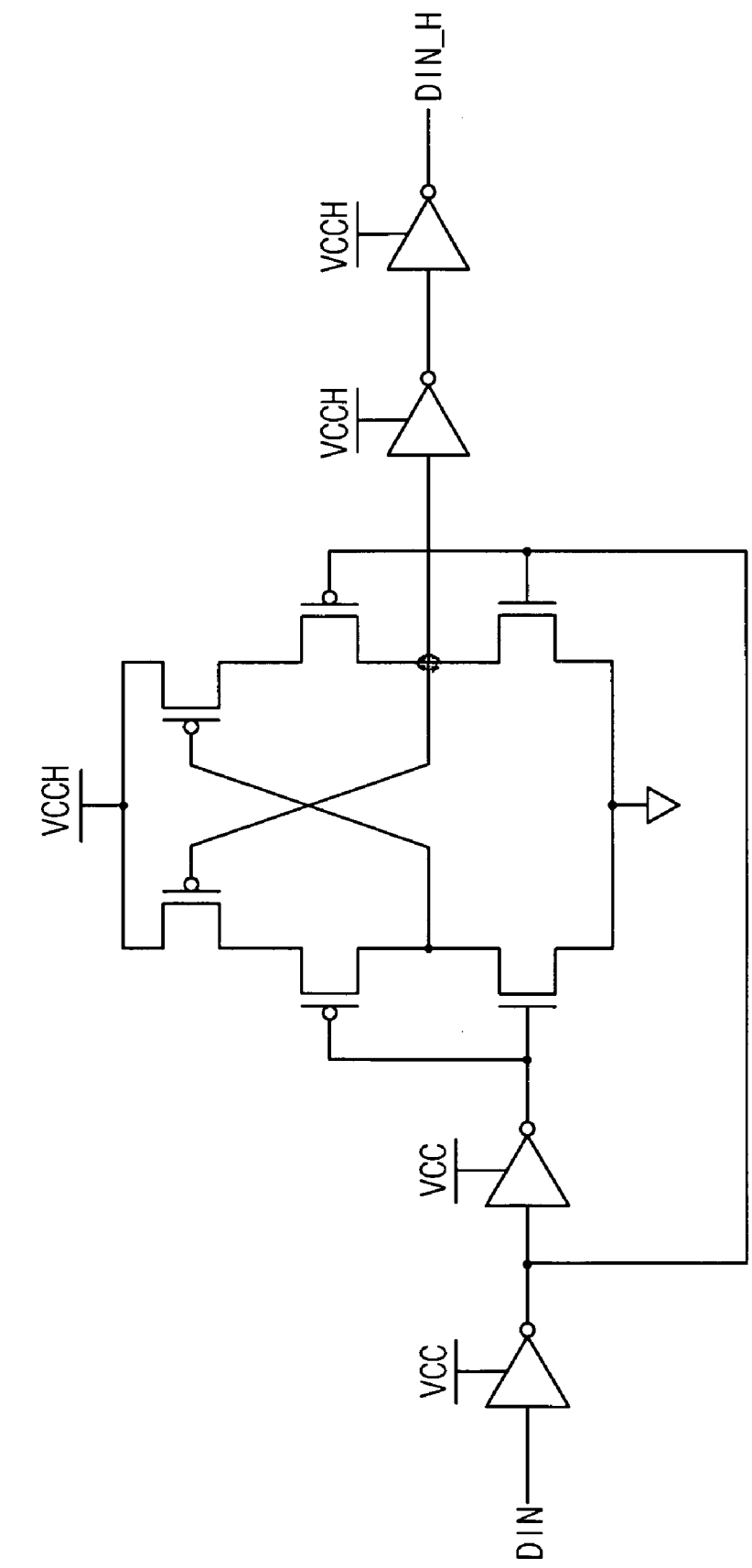
FIG. 4 is a circuit diagram illustrating a data input level shifter of a multi-time programmable semiconductor memory device according to an embodiment of the present invention.

FIG. 4 is a circuit diagram illustrating the data input level shifter 31 of a multi-time programmable semiconductor memory device according to an embodiment of the present invention.

Referring to FIG. 4, the data input level shifter 31 generates the data signal DIN_H in accordance with an internal operating voltage VCCH based on the data input signal DIN, which is in accordance with an external operating voltage VCC. For example, the external operating voltage VCC may have a voltage level of about 1.2V and the internal operating voltage may have a voltage level of about 3.3V, as already described with reference to FIG. 2.

The data input level shifter 31 may be implemented using a general level shifter and the data input level shifter 31 may have a structure similar or substantially the same as the structure of the write signal level shifter WRITE LEVEL SHIFTER 32, the address signal level shifter ADD<0:6> LEVEL SHIFTER 33, and the read signal level shifter READ LEVEL SHIFTER 34.

Figure 5:
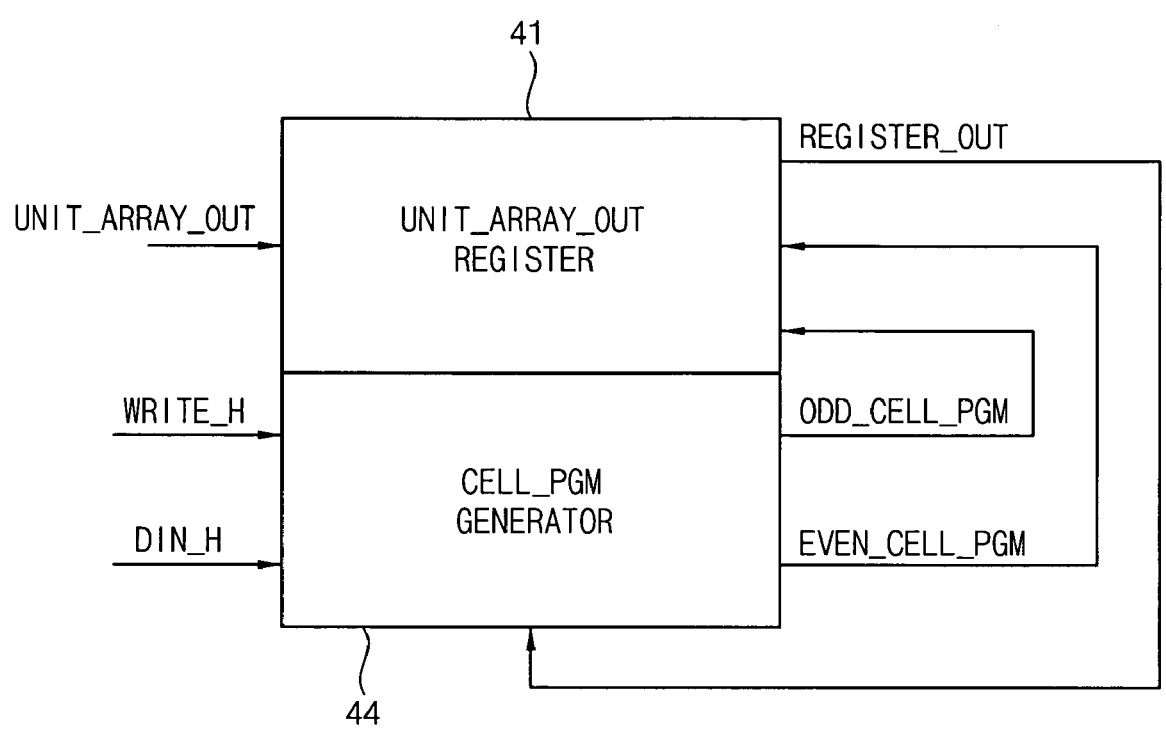
FIG. 5 is a block diagram illustrating a cell distributor of a multi-time programmable semiconductor memory device according to an embodiment of the present invention.

FIG. 5 is a block diagram illustrating the cell distributor 23 of a multi-time programmable semiconductor memory device according to an embodiment of the present invention.

Referring to FIG. 5, the cell distributor 23 includes a unit array output signal register UNIT_ARRAY_OUT REGISTER 41 and a cell programming signal generator CELL_PGM GENERATOR 44.

The unit array output signal register 41 reads and stores a value currently programmed in the selected programmable unit from the unit array 24 before programming the selected programmable unit to prevent an erroneous programming operation.

Namely, the unit array output signal register 41 transmits a register output signal REGISTER_OUT to the cell programming signal generator CELL_PGM GENERATOR 44 based on the array output signal UNIT_ARRAY_OUT outputted from the unit array 24.

The cell programming signal generator 44 receives the data signal DIN_H and the write signal WRITE_H from the level shifter 21 and the unit array output signal UNIT_ARRAY_OUT from the unit array 24 via the unit array output signal register 41.

The cell programming signal generator 44 generates the odd-numbered cell programming signal ODD_CELL_PGM and the even-numbered cell programming signal EVEN_CELL_PGM based on a logical combination of the data signal DIN_H, the write signal WRITE_H, and the unit array output signal UNIT_ARRAY_OUT. A relationship between the logical combination of the above signals and the odd-numbered cell programming signal ODD_CELL_PGM and the even-numbered cell programming signal EVEN_CELL_PGM may be represented as follows.

TABLE 1

| DIN_H | WRITE_H | UNIT_ARRAY_OUT | ODD_CELL_PGM | EVEN_CELL_PGM |
|---|---|---|---|---|
| 0 | 1 | 0 | 0 | 0 |
| 1 | 1 | 0 | 1 | 0 |
| 0 | 1 | 1 | 0 | 1 |
| 1 | 1 | 1 | 0 | 0 |

Referring to Table 1, the odd-numbered cell programming signal ODD_CELL_PGM and the even-numbered cell programming signal EVEN_CELL_PGM are generated when the write signal WRITE_H is activated.

When the unit array output signal UNIT_ARRAY_OUT has logic "0" and the data signal DIN_H has logic "0" (as illustrated in the first row), the current programming state of the selected programmable unit is maintained so that the odd-numbered cell programming signal ODD_CELL_PGM and the even-numbered cell programming signal EVEN_CELL_PGM are both non-activated, i.e., logic "0".

When the unit array output signal UNIT_ARRAY_OUT has logic "0" and the data signal DIN_H has logic "1" (as illustrated in the second row), the odd-numbered cell programming signal ODD_CELL_PGM is activated, i.e., logic "1".

When the unit array output signal UNIT_ARRAY_OUT has logic "1" and the data signal DIN_H has logic "0" (as illustrated in the third row), the even-numbered cell programming signal EVEN_CELL_PGM is activated, i.e., logic "1".

When the unit array output signal UNIT_ARRAY_OUT has logic "1" and the data signal DIN_H has logic "1" (as illustrated in the fourth row), the current programming state of the selected programmable unit is maintained similar to the first row circumstance so that the odd-numbered cell programming signal ODD_CELL_PGM and the even-numbered cell programming signal EVEN_CELL_PGM are both non-activated, i.e., logic "0".

Figure 6:
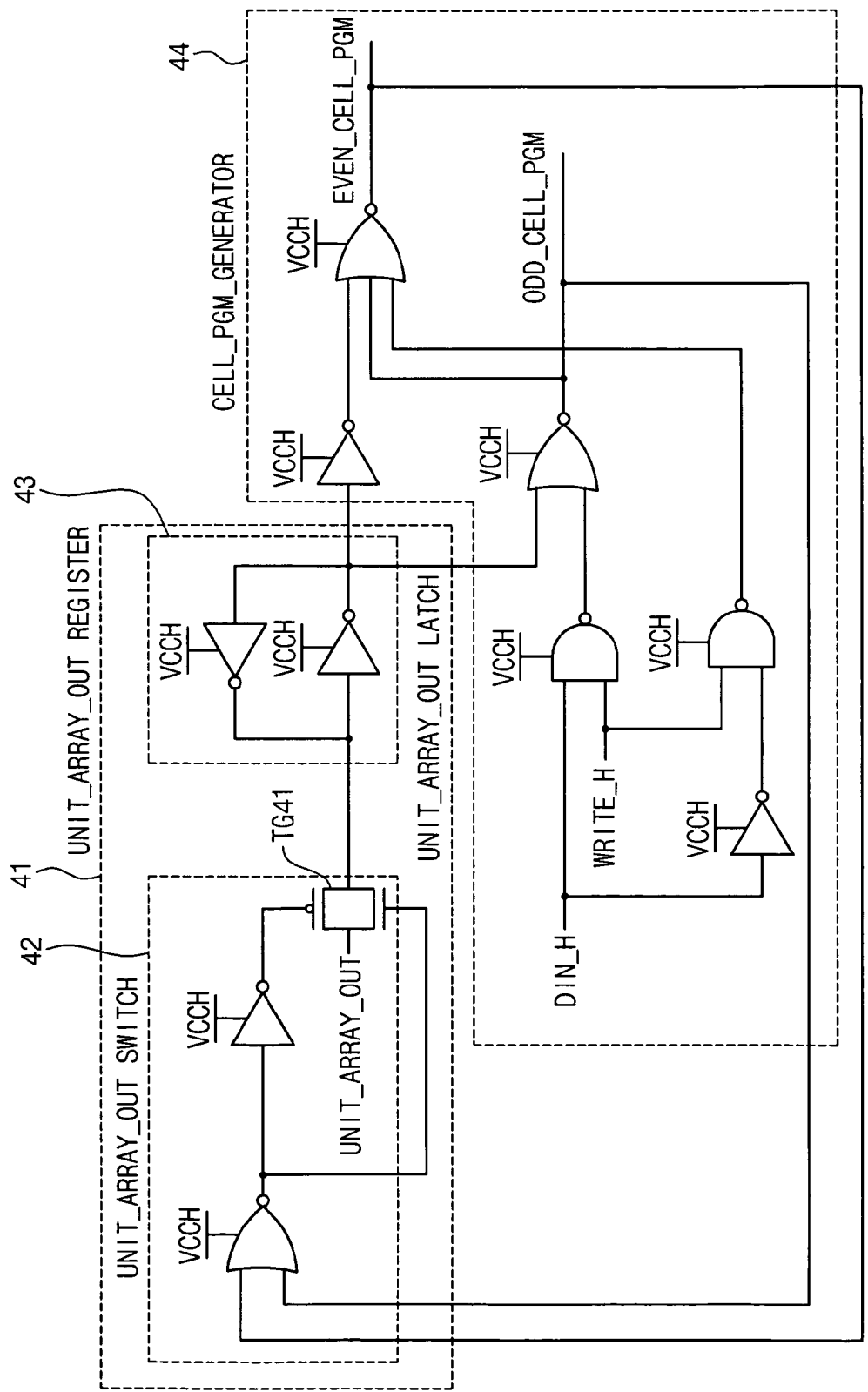
FIG. 6 is a circuit diagram illustrating a cell distributor of a multi-time programmable semiconductor memory device according to an embodiment of the present invention.

FIG. 6 is a circuit diagram illustrating the cell distributor 23 of a multi-time programmable semiconductor memory device according to an embodiment of the present invention.

Referring to FIG. 6, the cell distributor 23 includes the unit array output signal register UNIT_ARRAY_OUT REGISTER 41 and the cell programming signal generator CELL_PGM GENERATOR 44.

In addition, the unit array output signal register UNIT_ARRAY_OUT REGISTER 41 may further include a unit array output signal switch UNIT_ARRAY_OUT SWITCH 42 and a unit array output signal latch UNIT_ARRAY_OUT LATCH 43.

In the step of transferring data of the write operation, namely when the value written in the selected programmable unit is read, both the odd-numbered cell programming signal ODD_CELL_PGM and the even-numbered cell programming signal EVEN_CELL_PGM are non-activated. Therefore, a transmission gate TG41 of the unit array output signal switch UNIT_ARRAY_OUT SWITCH 42 is closed so that the unit array output signal UNIT_ARRAY_OUT is stored in the unit array output signal latch UNIT_ARRAY_OUT LATCH 43.

In the step of programming the selected programmable unit, at least one of the odd-numbered cell programming signal ODD_CELL_PGM and the even-numbered cell programming signal EVEN_CELL_PGM are activated so that transmission gate TG41 of the unit array output signal switch UNIT_ARRAY_OUT SWITCH 42 is open. The steps of transferring data and programming the OTP cell will be described below in detail.

Figure 7:
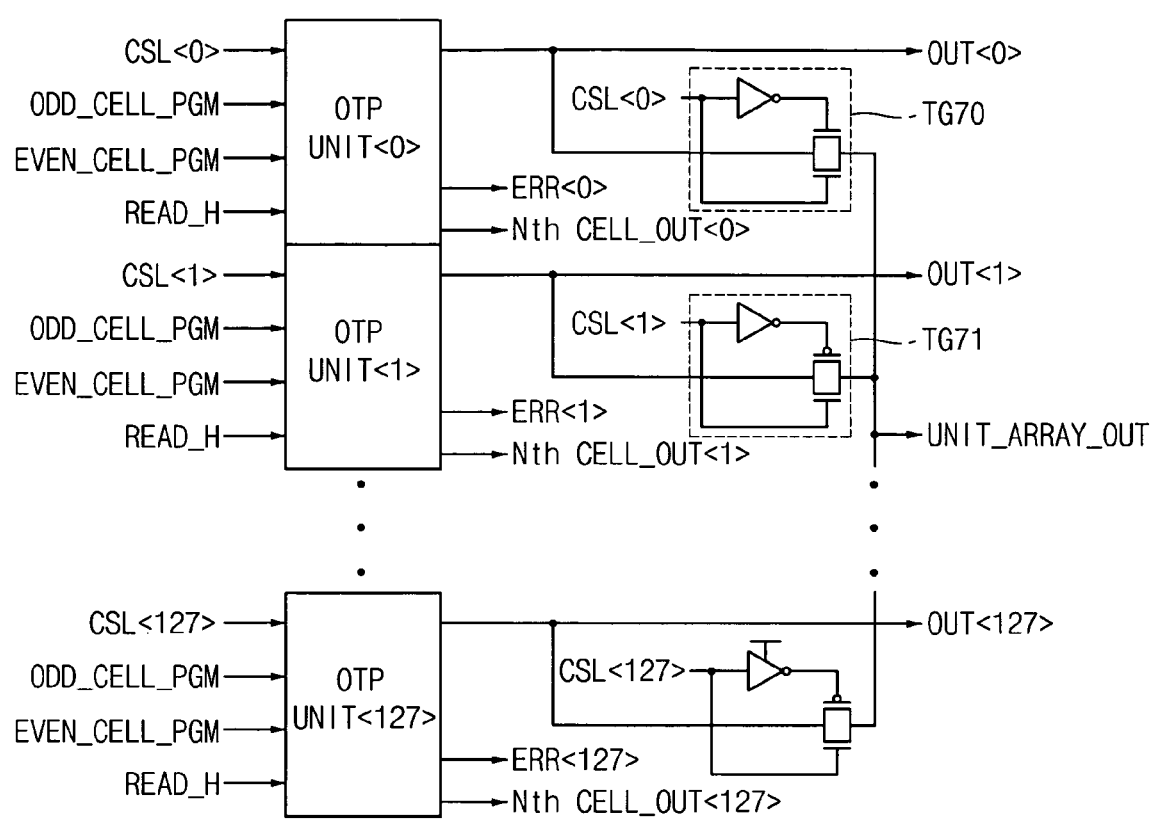
FIG. 7 is a block diagram illustrating a unit array of a multi-time programmable semiconductor memory device according to an embodiment of the present invention.

FIG. 7 is a block diagram illustrating the unit array 24 of a multi-time programmable semiconductor memory device according to an embodiment of the present invention.

Referring to FIG. 7, the unit array 24 according to an example embodiment of the present invention includes 128 programmable units for illustrative purposes.

The 128 programmable units of the unit array 24 output the unit output signal OUT<0:127> and the unit full state signal Nth CELL_OUT<0:127> in response to the unit select signal CSL<0:127> and the read signal READ_H.

In addition, the 128 programmable units of the unit array 24 output the unit error state signal ERR<0:127> based on the odd-numbered cell programming signal ODD_CELL_PGM and the even-numbered cell programming signal EVEN_CELL_PGM.

The unit output signal OUT<0:127> outputted from the unit array 24 is provided to the cell distributor 23 as the unit array output signal UNIT_ARRAY_OUT via one of the transmission gates TG70, TG71, ..., that is controlled by the unit select signal CSL<0:127> currently inputted.

In the read operation, the unit output signals OUT<0:127> of all the programmable units in the unit array are simultaneously outputted without selecting a particular programmable unit by the unit select signal CSL<0:127>. In the write operation, only the unit output signal OUT<N> of the programmable unit selected by the unit select signal CSL<N> is outputted and provided to the cell distributor 23 as the unit array output signal UNIT_ARRAY_OUT via the transmission gate disposed at an output port of the unit array 24.

Figure 8:
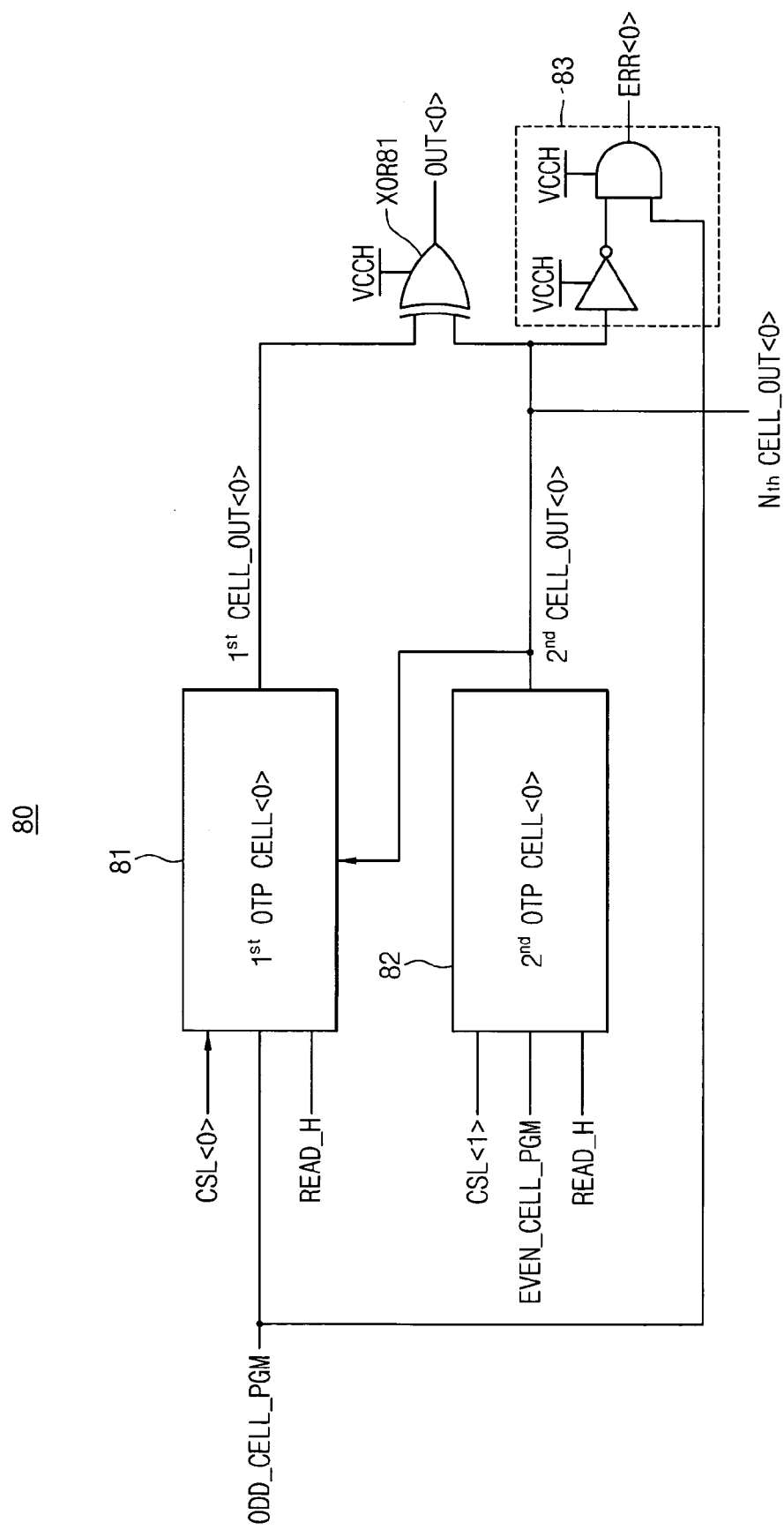
FIG. 8 is a block diagram illustrating a programmable unit of a unit array that may be programmed at least twice according to an embodiment of the present invention.

FIG. 8 is a block diagram illustrating a programmable unit 80 in the unit array 24 that may be programmed at least twice according to an embodiment of the present invention.

Referring to FIG. 8, the programmable unit 80 in the unit array 24 in FIG. 2 includes two OTP cells 81 and 82. The unit array 24 of the multi-time programmable semiconductor memory device 20 includes 128 programmable units. The 128 programmable units may have the same configurations. In FIG. 8, the programmable unit 80 may correspond to a 0th programmable unit among the 0th to 127th programmable units of the unit array 24.

A first OTP cell 81 of the programmable unit 80 in FIG. 8 receives the odd-numbered cell programming signal ODD_CELL_PGM and a second OTP cell 82 receives the even-numbered cell programming signal EVEN_CELL_PGM.

The programming state of the two OTP cells 81 and 82 are combined by an XOR gate XOR81 and outputted as a unit output signal OUT<0> so that the data may be programmed at least twice. Based on the programming states of the two OTP cells 81 and 82, the unit output signal OUT<0> may be determined.

Table 2 shows an example logic state of the unit output signal OUT<0> depending on the programming states of the OTP cells 81 and 82.

TABLE 2

| 1st CELL_OUT<0> | 2ND CELL_OUT<0> | OUT<0> |
|---|---|---|
| 1 | 1 | 0 |
| 0 | 1 | 1 |
| 0 | 0 | 0 |

Referring to Table 2, when both the first OTP cell 81 and the second OTP cell 82 are not programmed, (namely, a first CELL_OUT<0> and a second CELL_OUT<0> outputted from the first and second OTP cells 81 and 82 have logic "1") as illustrated in the first row, the unit output signal OUT<0> has logic "0". When the first OTP cell 81 is programmed (i.e., the first CELL_OUT<0> has logic "0") and the second OTP cell 82 is not programmed (i.e., the second CELL_OUT<0> has logic "1") as illustrated in the second row, the unit output signal OUT<0> has logic "1". When both the first OTP cell 81 and the second OTP cell 82 are programmed (i.e., the first CELL_OUT<0> and the second CELL_OUT<0> have logic "0"), as illustrated in the third row, the unit output signal OUT<0> has logic "0".

The second CELL_OUT<0> outputted from the second OTP cell 82 is provided to the first OTP cell 81 to prevent over-programming of the first OTP cell 81, which may occur when the first OTP cell 81 and the second OTP cell 82 are programmed. Namely, the first OTP cell 81 is programmable when the second OTP cell 82 is not programmed.

When both the first and second OTP cells 81 and 82 are programmed and an additional programming command for programming data of opposite logic is inputted, the unit error state signal ERR<0> is generated by the unit error state signal generator 83. For example, when the second OTP cell 82 is programmed and the odd-numbered cell programming signal ODD_CELL_PGM is again inputted to the first OTP cell 81 to transition the unit output signal OUT<0> to logic "1", the unit error state signal ERR<0> may be generated by the unit error state signal generator 83.

The programming state (i.e., the second CELL_OUT<0>) of the second OTP cell 82 is also provided as the unit full state signal Nth CELL_OUT<0>. The unit full state signal Nth CELL_OUT<0> is inputted to the full state detector 25 to indicate the full state of the unit array 24. In addition, the unit full state signal Nth CELL_OUT<0> may be transmitted to the user via the level down converter 27 in FIG. 2 to indicate the full state of the programmable unit.

Figure 9:
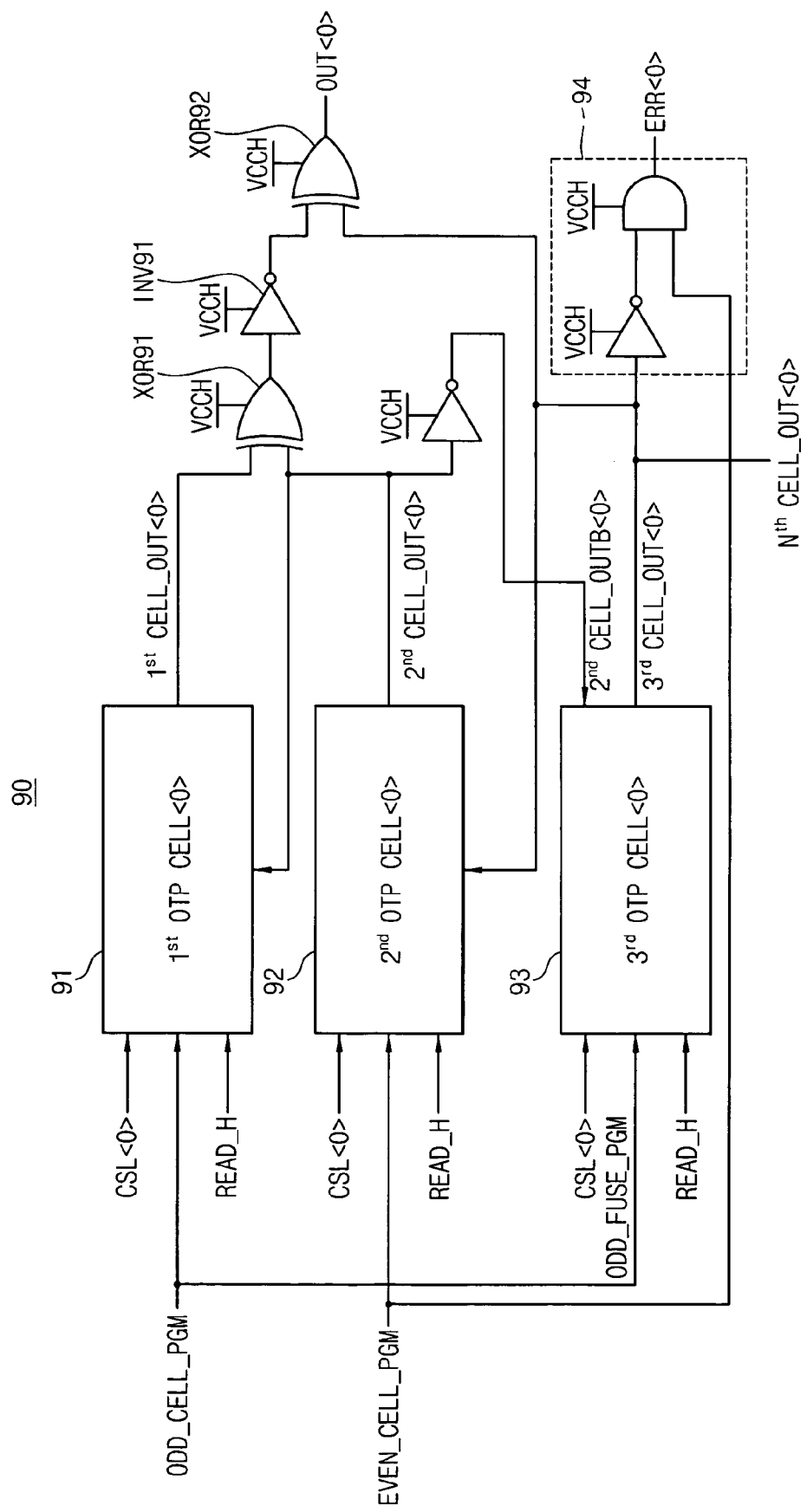
FIG. 9 is a block diagram illustrating a programmable unit of a unit array that may be programmed at least three times according to an embodiment of the present invention.

FIG. 9 is a block diagram illustrating a programmable unit 90 of a unit array 24 that may be programmed at least three times according to an embodiment of the present invention.

The programmable unit 90 includes a first OTP cell 91, a second OTP cell 92, and a third OTP cell 93. The first OTP cell 91 and the third OTP cell 93 receive the odd-numbered cell programming signal ODD_CELL_PGM and the second OTP cell 92 receives the even-numbered cell programming signal EVEN_CELL_PGM.

An XOR gate XOR91 is used to perform a logical XOR operation on the programming states (first CELL_OUT<0> and second CELL_OUT<0>) of the first OTP cell 91 and the second OTP cell 92, and an XOR gate XOR92 is used to perform a logical XOR operation on the programming state (third CELL_OUT<0>) of the third OTP cell 93 and an inverted output of the XOR gate XOR91. The unit output signal OUT<0> is outputted from the XOR gate XOR92.

Table 3 shows an example logic state of the unit output signal OUT<0> depending on the programming states of the OTP cells 91, 92, and 93.

TABLE 3

| 1st CELL_OUT<0> | 2ND CELL_OUT<0> | 3rd CELL_OUT<0> | OUT<0> |
|---|---|---|---|
| 1 | 1 | 1 | 0 |
| 0 | 1 | 1 | 1 |
| 0 | 0 | 1 | 0 |
| 0 | 0 | 0 | 1 |

Referring to Table 3, when the first through third OTP cells 91, 92, and 93 are not programmed, (namely, the first CELL_OUT<0>, the second CELL_OUT<0>, and the third CELL_OUT<0> have all logic "1") as illustrated in the first row, the unit output signal OUT<0> has logic "0". When the first OTP cell 91 is programmed (i.e., the first CELL_OUT<0> has logic "0") and the second and third OTP cells 92 and 93 are not programmed (i.e., the second CELL_OUT<0> and the third CELL_OUT<0> have logic "1") as illustrated in the second row, the unit output signal OUT<0> has logic "1". When both the first OTP cell 91 and the second OTP cell 92 are programmed (i.e., the first CELL_OUT<0> and the second CELL_OUT<0> have logic "0") and the third OTP cell 93 is not programmed (i.e., the third CELL_OUT<0> has logic "1"), as illustrated in the third row, the unit output signal OUT<0> has logic "0". When the first through third OTP cells 91, 92, and 93 are programmed, (namely, the first CELL_OUT<0>, the second CELL_OUT<0>, and the third CELL_OUT<0> have all logic "0") as illustrated in a fourth row, the unit output signal OUT<0> has logic "1".

The second CELL_OUT<0> outputted from the second OTP cell 92 is provided to the first OTP cell 91 so that the first OTP cell 91 may be programmed only if the second OTP cell 92 is not programmed. In addition, an inverted output of the second OTP cell 92, second CELL_OUTB<0>, is provided to the third OTP cell 93 so that the third OTP cell 93 may be programmed only if the second OTP cell 92 is programmed. An output of the third OTP cell 93, third CELL_OUTB<0>, is provided to the second OTP cell 92 so that the second OTP cell 92 may be programmed only if the third OTP cell 93 is not programmed.

Therefore, over-programming of the second OTP cell 92, which may occur when the first through third OTP cells 91, 92, and 93 are programmed, may be prevented. Namely, the over-programming of the second OTP cell 92 may be prevented by the even-numbered cell programming signal EVEN_CELL_PGM when the first through third OTP cells 91, 92, and 93 are programmed, i.e., the unit output signal OUT<0> has logic "1".

When the first through third OTP cells 91, 92, and 93 are programmed and an additional programming command for programming data of opposite logic is inputted, the unit error state signal ERR<0> is generated by a unit error state signal generator 94. For example, when the third OTP cell 93 is programmed and the even-numbered cell programming signal EVEN_CELL_PGM is again inputted to the second OTP cell 93, the unit error state signal ERR<0> may be generated by the unit error state signal generator 94.

The programming state (i.e., the third CELL_OUT<0>) of the third OTP cell 93 is also provided as the unit full state signal Nth CELL_OUT<0>. The unit full state signal Nth CELL_OUT<0> is inputted to the full state detector 25 to indicate the full state of the unit array 24. In addition, the unit full state signal Nth CELL_OUT<0> may be transmitted to the user via the level down converter 27 in FIG. 2 to indicate the full state of the programmable unit.

Figure 10:
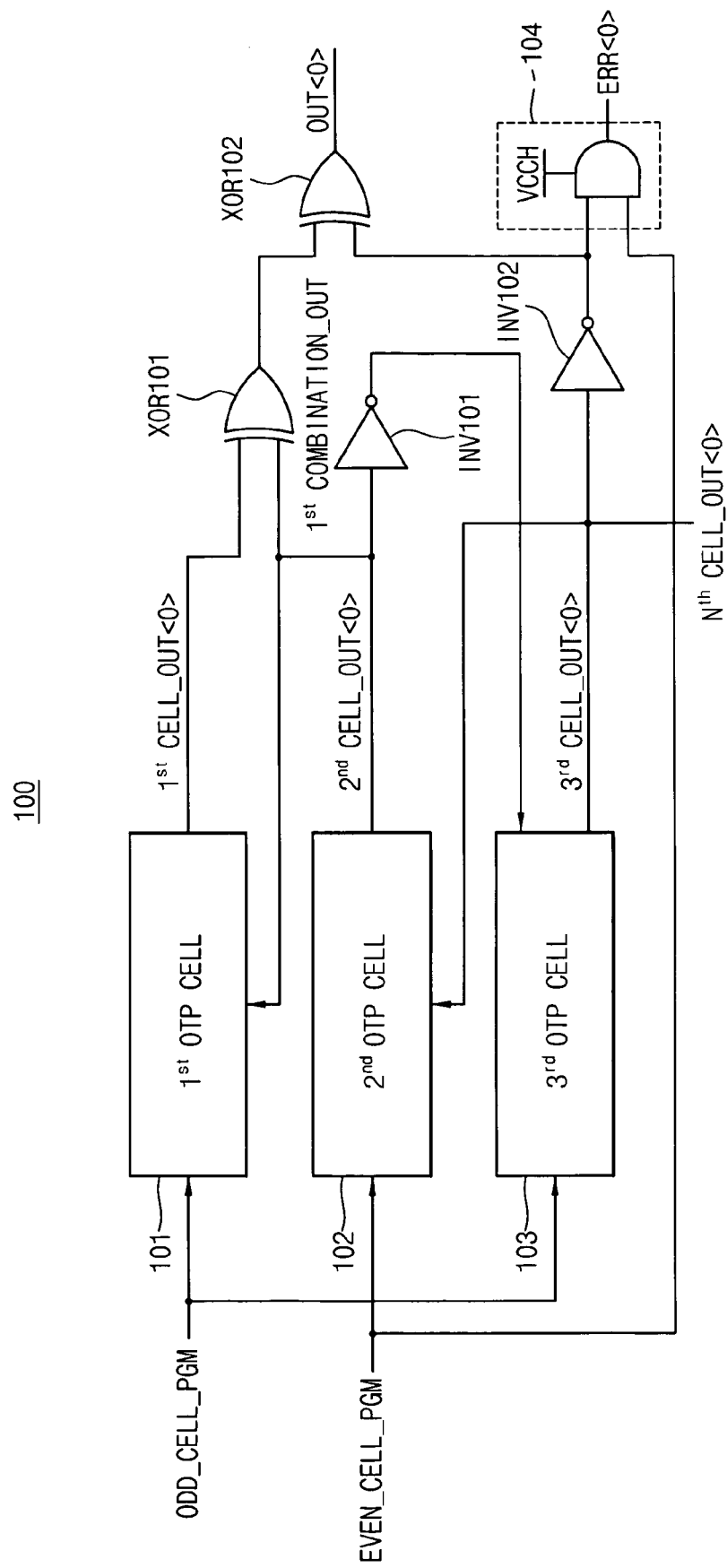
FIG. 10 is a block diagram illustrating a programmable unit of a unit array that may be programmed at least three times according to another embodiment of the present invention.

FIG. 10 is a block diagram illustrating a programmable unit 100 of a unit array 24 that may be programmed at least three times according to another embodiment of the present invention.

Similar to the programmable unit 90 in FIG. 9, the programmable unit 100 in FIG. 10 includes a first OTP cell 101, a second OTP cell 102, and a third OTP cell 103. The first OTP cell 101 and the third OTP cell 103 receive the odd-numbered cell programming signal ODD_CELL_PGM and the second OTP cell 102 receives the even-numbered cell programming signal EVEN_CELL_PGM.

However, the programmable unit 100 is different from the programmable unit 90 in that a logical XOR operation is performed on the programming states (first CELL_OUT<0> and second CELL_OUT<0>) of the first OTP cell 101 and the second OTP cell 102 to generate a first combination result $1^{st}$ COMBINATION_OUT and a logical XOR operation is again performed on the first combination result $1^{st}$ COMBINATION_OUT outputted from the XOR gate XOR101 and an inverted programming state of the third OTP cell 103 by an XOR gate XOR102 to output the unit output signal OUT<0>.

A different logical combination may be used such that the unit output signal OUT<0> produced in accordance with Table 3 is outputted.

The connection between outputs of the OTP cells configured to prevent the over-programming, outputting the unit error state signal based upon detection of the unit error state, and outputting the unit full state signal are similar or substantially similar to FIG. 9 and any further explanation will be omitted.

The number of the programmable units may vary according to a possible number of times of programming. For example, the programmable unit may include N OTP cells to ensure at least N number of times of programming.

In addition, the OTP cells in the programmable unit may combine respective outputs thereof using an XOR gate and an inverter to generate the unit output signal of the programmable unit.

For example, in case of the programmable unit 90 in FIG. 9 that may be programmed at least N times, N XOR gates and N−1 inverters may be used to generate the unit output signal thereof. In case of the programmable unit 100 in FIG. 10 that may be programmed at least N times, N−1 XOR gates and one inverter may be used to generate the unit output signal.

Namely, when all the OTP cells in the programmable unit are not programmed or an even number of OTP cells are programmed, the unit output signal of the programmable unit (that is outputted as the data of the programmable unit) is set to logic "0". When an odd number of OTP cells among the OTP cells of the programmable unit are programmed, the unit output signal of the programmable unit (that is outputted as the data of the programmable unit) is set to logic "1".

Therefore, it is noted that other similar logic combinations of the programming states of the OTP cells that satisfy the above conditions may be used.

Figure 11:
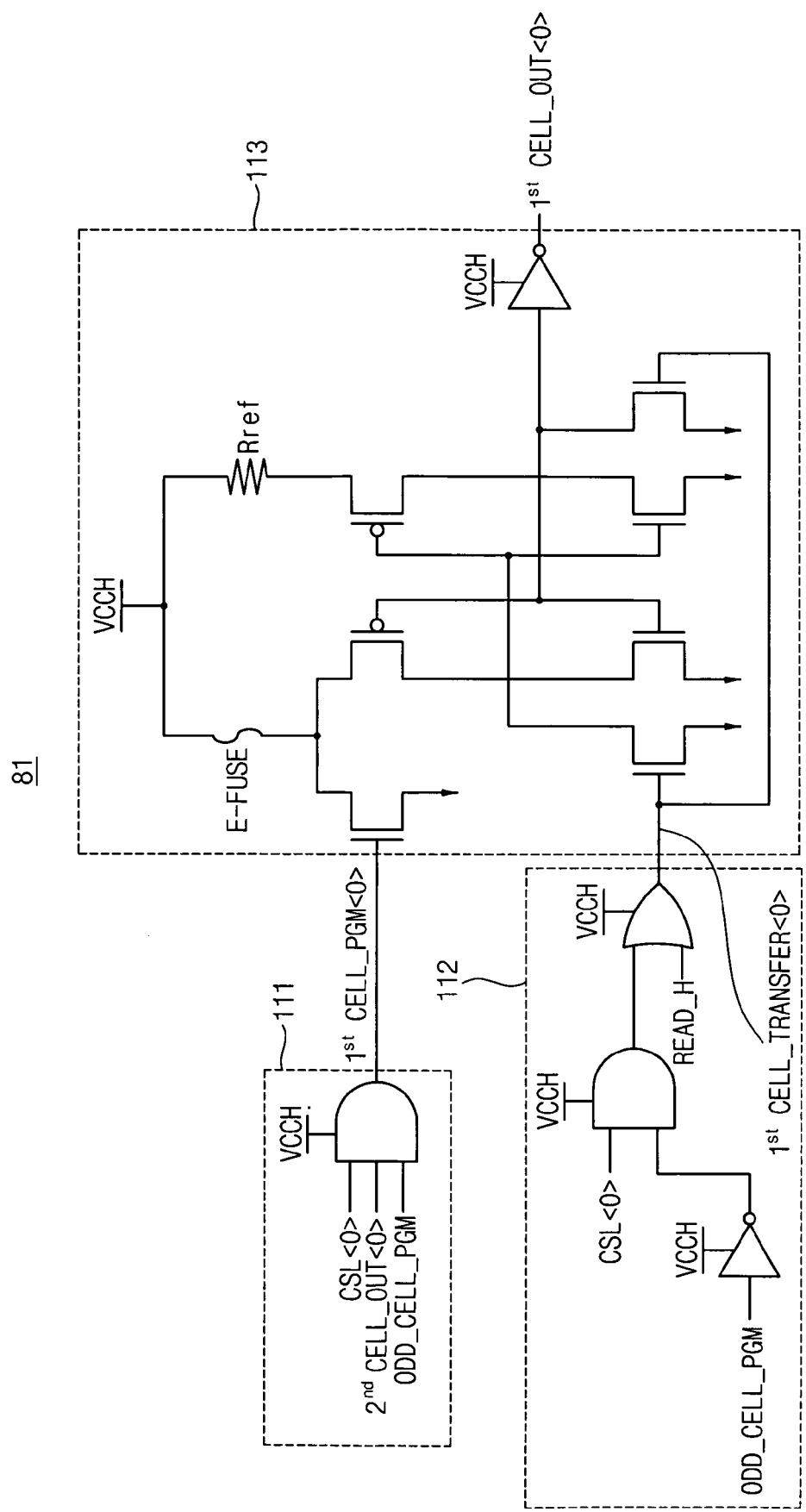
FIG. 11 is a circuit diagram illustrating a first OTP cell of a programmable unit according to an embodiment of the present invention.

FIG. 11 is a circuit diagram illustrating a first OTP cell of the programmable unit according to an embodiment of the present invention. In FIG. 11, the first OTP cell is the first OTP cell 81 of the programmable unit 80 in FIG. 8 for illustrative purposes.

Referring to FIG. 11, the first OTP cell 81 includes a cell programming signal generating unit 111 for generating a cell programming signal $1^{st}$ CELL_PGM<0>, a cell data transfer signal generating unit 112 for generating a cell data transfer signal $1^{st}$ CELL_TRANSFER<0>, and a cell controller 113. In the cell controller 113, the OTP cell may be implemented using an electrically programmed fuse E-FUSE. Alternatively, the OTP cell may be implemented using an anti-fuse, and other various elements in different embodiments may be used for the OTP cell.

The first OTP cell 81 may operate in read and write operations, and the second OTP cell 82 operates in a similar manner.

In the read operation, when the read signal READ_H is activated, the cell data transfer signal $1^{st}$ CELL_TRANSFER<0> is outputted from the cell data transfer signal generating unit 112 to the cell controller 113. The cell controller 113 outputs the programming state of the OTP cell, e.g., the electrically programmed fuse E-FUSE, in FIG. 11 as the output of the first OTP cell 81, $1^{st}$ CELL_OUT<0>.

The write operation may include a step of transferring data during which the programming state of the corresponding OTP cell is read, and a step of programming the OTP cell.

In the step of transferring data, the unit select signal CSL<0>, applied to the cell data transfer signal generating unit 112, is activated and the odd-numbered cell programming signal ODD_CELL_PGM is deactivated. When the cell data transfer signal $1^{st}$ CELL_TRANSFER<0> is activated at the cell data transfer signal generating unit 112, the programming state of the OTP cell, e.g., the electrically programmed fuse E-FUSE, is outputted from the cell controller 113 as the output of the first OTP cell 81, $1^{st}$ CELL_OUT<0>. Thus, the data transfer step is substantially similar to the above-described read operation.

The programming step of the write operation is performed when the odd-numbered cell programming signal ODD_CELL_PGM is activated by the cell distributor 23. When the cell programming signal ODD_CELL_PGM is activated, performing the step of transferring data is terminated, and whether the programming step is performed is determined depending on the output of the second OTP cell 82, $2^{nd}$ CELL_OUT<0>.

When the output of the second OTP cell 82, $2^{nd}$ CELL_OUT<0>, has logic "0", namely, when the second OTP cell 82 is programmed, the cell programming signal $1^{st}$ CELL_PGM<0> is deactivated so that programming of the OTP cell, e.g., the electrically programmed fuse E-FUSE, is not performed. Conversely, when the output of the second OTP cell 82, $2^{nd}$ CELL_OUT<0>, has logic "1", namely, when the second OTP cell 82 is not programmed, the cell programming signal $1^{st}$ CELL_PGM<0> is activated so that the programming of the OTP cell, e.g., the electrically programmed fuse E-FUSE, is performed.

As described above, the structure of the cell controller 113 for programming and reading the programming state of the electrically programmed fuse illustrated in FIG. 11 is given by way of illustration only and thus may vary according to the OTP cell employed. Also, the cell controller 113 may be implemented in different configurations for the same OTP cell.

Figure 12:
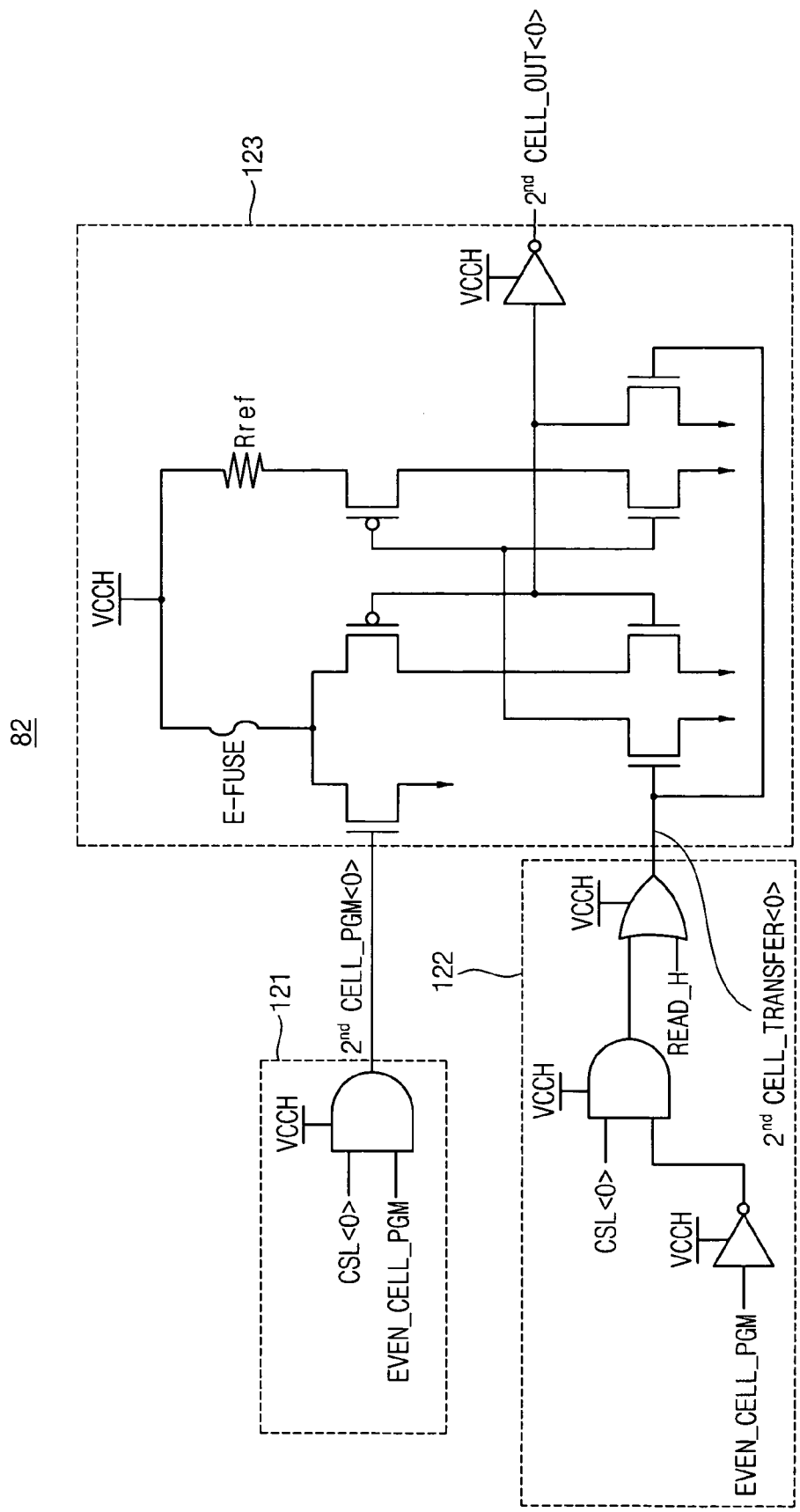
FIG. 12 is a circuit diagram illustrating a second OTP cell of a programmable unit according to an embodiment of the present invention.

FIG. 12 is a circuit diagram illustrating a second OTP cell of the programmable unit 80 according to an embodiment of the present invention. In FIG. 12, the second OTP cell is the second OTP cell 82 of the programmable unit 80 in FIG. 8 for illustrative purposes.

Referring to FIG. 12, similar to the first OTP cell 81, the second OTP cell 82 includes a cell programming signal generating unit 121 for generating a cell programming signal $2^{nd}$ CELL_PGM<0>, a cell data transfer signal generating unit 122 for generating a cell data transfer signal $2^{nd}$ CELL_TRANSFER<0>, and a cell controller 123. In the cell controller 123, the OTP cell may be implemented using an electrically programmed fuse E-FUSE. Alternatively, the OTP cell may be implemented using an anti-fuse, and other various elements in different embodiments may be used for the OTP cell.

The second OTP cell 82 may operate in read and write operations.

In the read operation and in the data transfer step of the write operation, the cell programming signal generating unit 121, the cell data transfer signal generating unit 122 and the cell controller 123 are similar in function to analogous elements already described with reference to FIG. 11 except that the second OTP cell 82 receives the even-numbered cell programming signal EVEN_CELL_PGM instead of the odd-numbered cell programming signal ODD_CELL_PGM.

In addition, in the programming step of the write operation, while the first OTP cell 81 determines the programming of, for example, the electrically programmed fuse E-FUSE based on the output of the second OTP cell 82, $2^{nd}$ CELL_OUT<0>, the second OTP cell 82 determines the programming of the OTP cell independently of the programming state of another OTP cell. When the programmable unit includes two OTP cells, over-programming may occur only when the OTP cell is programmed by the odd-numbered cell programming signal ODD_CELL_PGM so that the second OTP cell 82, which is programmed by the even-numbered cell programming signal EVEN_CELL_PGM, may not need to check the programming state of another OTP cell.

Figure 13:
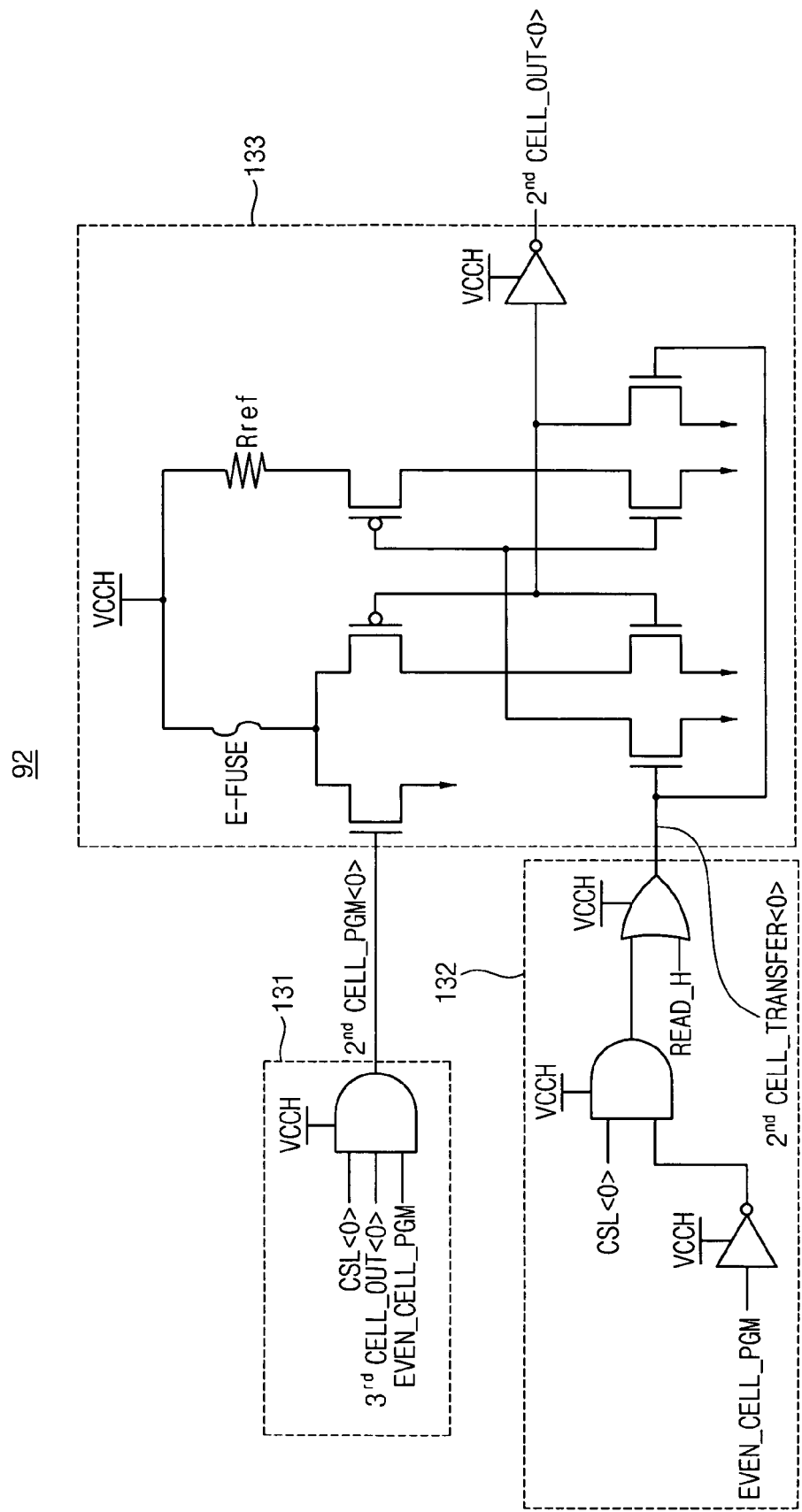
FIG. 13 is a circuit diagram illustrating a second OTP cell of the programmable unit that may be programmed at least three times according to an embodiment of the present invention.

FIG. 13 is a circuit diagram illustrating a second OTP cell of the programmable unit that may be programmed at least three times according to an embodiment of the present invention. In FIG. 13, the OTP cell is the second OTP cell 92 of the programmable unit 90 in FIG. 9 for illustrative purposes. In addition, the second OTP cell 102 of the programmable unit 100 in FIG. 10 may have the same structure as the second OTP cell 92 in FIG. 13.

The structure of the first OTP cells 91 and 101 of the programmable units 90 and 100 respectively illustrated in FIGS. 10 and 11 may have substantially the same structure as the first OTP cell 81 in FIG. 11, and therefore any further explanation will be omitted.

Referring to FIG. 13, the second OTP cell 92 includes a cell programming signal generating unit 131 for generating a cell programming signal $2^{nd}$ CELL_PGM<0>, a cell data transfer signal generating unit 132 for generating a cell data transfer signal $2^{nd}$ CELL_TRANSFER<0>, and a cell controller 133.

In the read operation, when the read signal READ_H is activated, the cell data transfer signal $2^{nd}$ CELL_TRANSFER<0> is outputted from the cell data transfer signal generating unit 132 to the cell controller 133. The cell controller 133 outputs the programming state of the OTP cell, e.g., the electrically programmed fuse E-FUSE, as the output of the second OTP cell 92, $2^{nd}$ CELL_OUT<0>.

In the data transfer step of the write operation, the unit select signal CSL<0>, applied to the cell data transfer signal generating unit 132, is activated and the even-numbered cell programming signal EVEN_CELL_PGM is deactivated. Then the cell data transfer signal $2^{nd}$ CELL_TRANSFER<0> is activated so that the programming state of the OTP cell, e.g., the electrically programmed fuse E-FUSE, is outputted from the cell controller 133 as the output of the second OTP cell 92, $2^{nd}$ CELL_OUT<0>.

In the programming step of the write operation, the even-numbered cell programming signal EVEN_CELL_PGM is activated by the cell distributor 23. When the cell programming signal EVEN_CELL_PGM is activated, performing the step of transferring data is terminated, and whether the programming step is performed is determined depending on the output of the third OTP cell 93, $3^{rd}$ CELL_OUT<0>.

When the output of the third OTP cell 93, $3^{rd}$ CELL_OUT<0>, has logic "0", the cell programming signal $2^{nd}$ CELL_PGM<0> is deactivated so that programming of the OTP cell, e.g., the electrically programmed fuse E-FUSE, is not performed. Conversely, when the output of the third OTP cell 93, $3^{rd}$ CELL_OUT<0>, has logic "1", the cell programming signal $2^{nd}$ CELL_PGM<0> is activated so that the programming of the OTP cell, e.g., the electrically programmed fuse E-FUSE, is performed.

Figure 14:
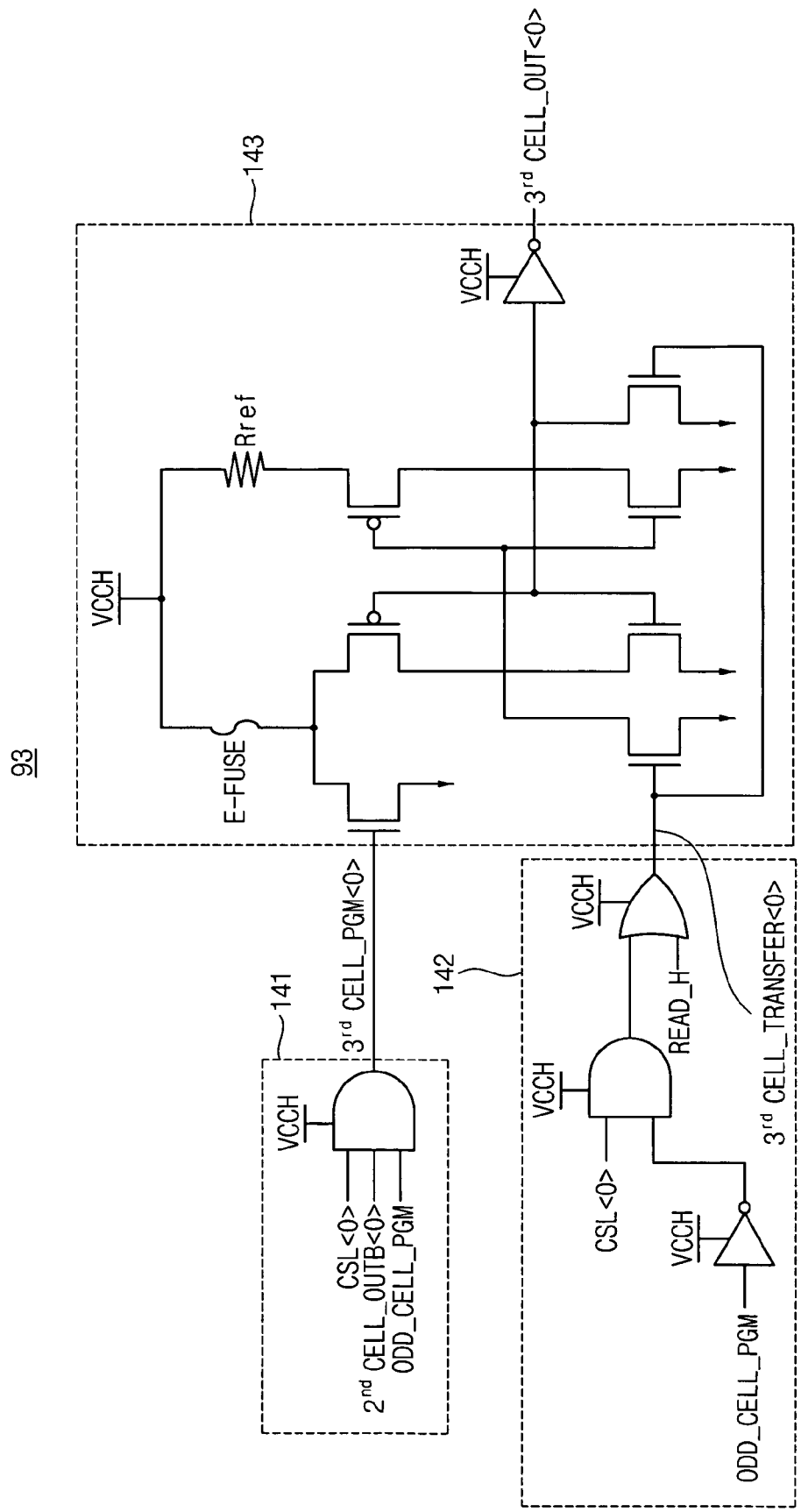
FIG. 14 is a circuit diagram illustrating a third OTP cell of a programmable unit according to an embodiment of the present invention.

FIG. 14 is a circuit diagram illustrating a third OTP cell of the programmable unit that may be programmed at least three times according to an embodiment of the present invention. In FIG. 14, the OTP cell is the third OTP cell 93 of the programmable unit 90 in FIG. 9 for illustrative purposes. In addition, the third OTP cell 103 of the programmable unit 100 in FIG. 10 may have the same structure as the third OTP cell 103 in FIG. 14.

Referring to FIG. 14, similar to the OTP cells 81, 82, and 92 in FIGS. 11, 12, and 13, respectively, the third OTP cell 93 may include a cell programming signal generating unit 141 for generating a cell programming signal $3^{rd}$ CELL_PGM<0>, a cell data transfer signal generating unit 142 for generating a cell data transfer signal $3^{rd}$ CELL_TRANSFER<0>, and a cell controller 143.

In the data transfer step of the write operation, when the unit select signal CSL<0>, applied to the cell data transfer signal generating unit 142, is activated and the odd-numbered cell programming signal ODD_CELL_PGM is deactivated, the cell data transfer signal $2^{nd}$ CELL_TRANSFER<0> is activated so that the programming state of the OTP cell, e.g., the electrically programmed fuse E-FUSE, is outputted from the cell controller 143 as $3^{rd}$ CELL_OUT<0>.

In the programming step of the write operation, when the odd-numbered cell programming signal ODD_CELL_PGM is activated by the cell distributor 23, performing the step of transferring data is terminated, and whether the programming step is performed is determined depending on an inverted output of the second OTP cell 92, $2^{nd}$ CELL_OUTB<0>.

When the inverted output of the second OTP cell 92, $2^{nd}$ CELL_OUTB<0>, has logic "0", the cell programming signal $3^{rd}$ CELL_PGM<0> is deactivated so that programming of the OTP cell, e.g., the electrically programmed fuse E-FUSE, is not performed. Conversely, when the inverted output of the second OTP cell 92, $2^{nd}$ CELL_OUT<0>, has logic "1", the cell programming signal $3^{rd}$ CELL_PGM<0> is activated so that the programming of the OTP cell, e.g., the electrically programmed fuse E-FUSE, is performed.

Figure 15:
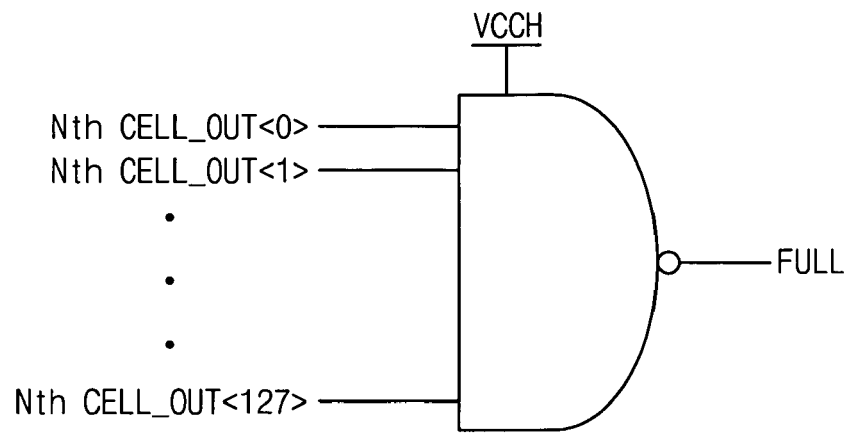
FIG. 15 is a circuit diagram illustrating a full state detector of a multi-time programmable semiconductor memory device according to an embodiment of the present invention.

FIG. 15 is a circuit diagram illustrating the full state detector 25 of a multi-time programmable semiconductor memory device according to an embodiment of the present invention.

Referring to FIG. 15, the full state detector 25 includes a NAND gate that performs a logical NAND operation on the unit full state signals Nth CELL_OUT<0:127> outputted from the respective programmable units of the unit array 24.

Therefore, when any one of the unit full state signals Nth CELL_OUT<0:127> outputted from the respective programmable units of the unit array 24 has logic "0", the full state signal FULL is outputted from the full state detector 25.

Figure 16:
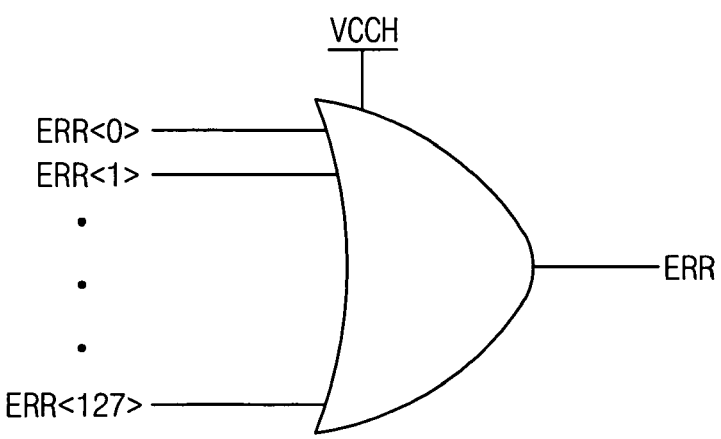
FIG. 16 is a circuit diagram illustrating an error detector of a multi-time programmable semiconductor memory device according to an embodiment of the present invention.

FIG. 16 is a circuit diagram illustrating the error detector 26 of a multi-time programmable semiconductor memory device according to an embodiment of the present invention.

Referring to FIG. 16, the error detector 26 includes an OR gate that performs a logical OR operation on the unit error state signals ERR<0:127> outputted from the respective programmable units of the unit array 24.

Therefore, when any one of the error state signals ERR<0:127> outputted from the respective programmable units of the unit array 24 has logic "1", the error signal ERR is outputted from the error detector 26.

Figure 17:
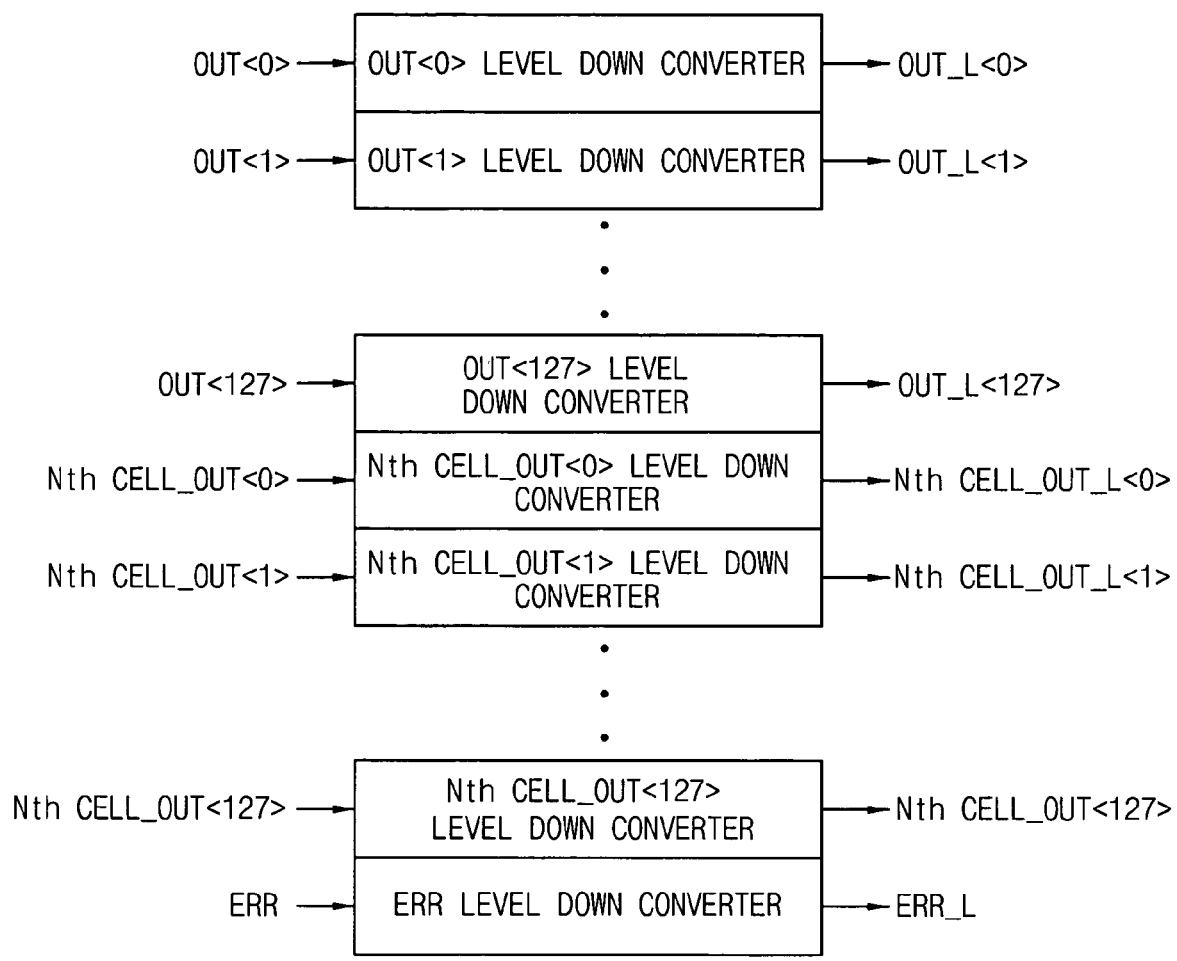
FIG. 17 is a block diagram illustrating a level down converter of a multi-time programmable semiconductor memory device according to an embodiment of the present invention.

FIG. 17 is a block diagram illustrating the level down converter 27 of a multi-time programmable semiconductor memory device according to an embodiment of the present invention.

Referring to FIG. 17, the level down converter 27 includes 128 level down converters OUT<0:127> LEVEL DOWN CONVERTER for the unit output signal, 128 level down converters Nth CELL_OUT<0:127> LEVEL DOWN CONVERTER for the unit full state signals, and a level down converter ERR LEVEL DOWN CONVERTER for the error state signal.

The respective level down converters generate the external unit output signal OUT_L<0:127>, the external unit full state signal Nth CELL_OUT_L<0:127>, and an external error state signal ERR_L based on the unit output signal OUT<0:127>, the unit full state signal Nth CELL_OUT<0:127>, and the error state signal ERR, respectively.

Figure 18:
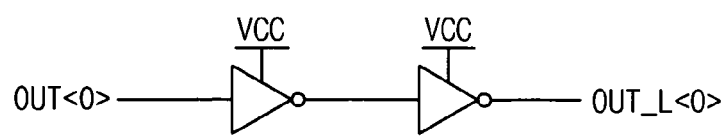
FIG. 18 is a circuit diagram illustrating an example configuration of a level down converter of a multi-time programmable semiconductor memory device according to an embodiment of the present invention.

FIG. 18 is a circuit diagram illustrating an example configuration of the level down converter 27 of a multi-time programmable semiconductor memory device according to an embodiment of the present invention. In FIG. 18, a first level down converter OUT<0> LEVEL DOWN CONVERTER for the unit output signal is shown.

Referring to FIG. 18, the level down converter OUT<0> LEVEL DOWN CONVERTER for the unit output signal includes two inverters that are serially coupled to each other to level down the unit output signal OUT<0> to a voltage level VCC of the external signal. The level down converter Nth CELL_OUT<0:127> LEVEL DOWN CONVERTER for the unit full state signals and the level down converter ERR LEVEL DOWN CONVERTER for the error state signal may have substantially the same structure as shown in FIG. 18.

Figure 19:
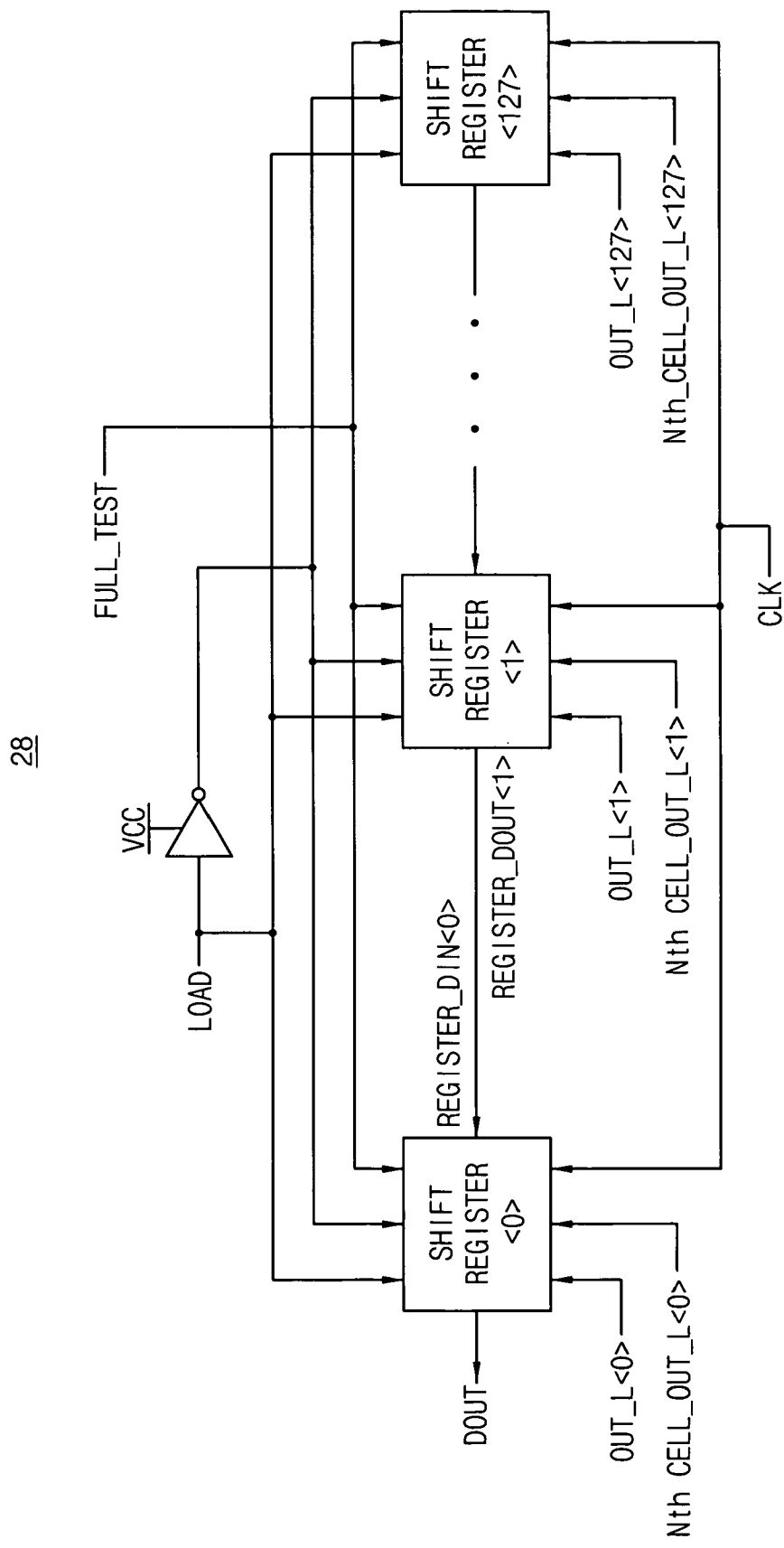
FIG. 19 is a block diagram illustrating a shift register circuit of a multi-time programmable semiconductor memory device according to an embodiment of the present invention.

FIG. 19 is a block diagram illustrating the shift register circuit 28 of a multi-time programmable semiconductor memory device according to an embodiment of the present invention.

Referring to FIG. 19, the shift register circuit 28 includes a total of 128 shift registers SHIFT REGISTER<0:127> that are serially coupled.

The 128 shift registers SHIFT REGISTER<0:127> receive the external unit output signal OUT_L<0:127> and the external unit full state signal Nth CELL_OUT_L<0: 127> from the level down converter 27 based on a load signal LOAD.

In addition, the 128 shift registers SHIFT REGISTER <0:127> sequentially output the external unit output signal OUT_L<0:127> and the external unit full state signal Nth CELL_OUT_L<0:127> to the output data pad DOUT. Namely, the shift register circuit 28 according to an example embodiment of the present invention outputs serial data based on 128-bit data that are parallel outputted from the programmable units of the unit array 24 in response to the read signal READ_H.

The full state test signal FULL_TEST is used to select one of the external unit output signal OUT_L<0:127> and the external unit full state signal Nth CELL_OUT_L<0:127> that are outputted from the level down converter 27 to be loaded on the shift registers SHIFT REGISTER<0:127>.

When the full state test signal FULL_TEST has logic "0", the external unit output signals OUT_L<0:127> are loaded on the shift registers SHIFT REGISTER<0:127> and when the full state test signal FULL_TEST has logic "1", the external unit full state signals Nth CELL_OUT_L<0:127> are loaded on the shift registers SHIFT REGISTER<0:127>.

Figure 20:
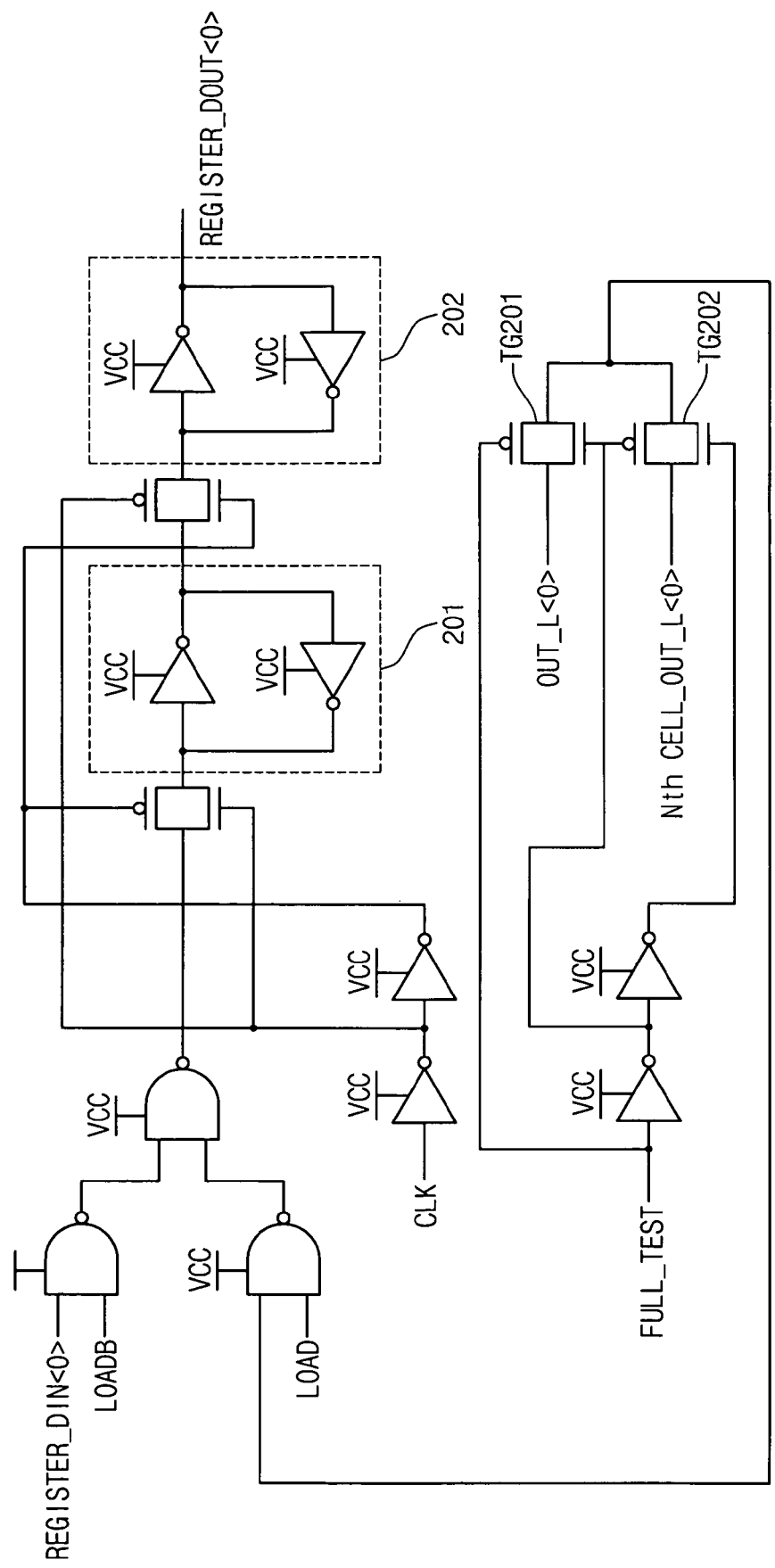
FIG. 20 is a circuit diagram illustrating an example shift register of a shift register circuit of a multi-time programmable semiconductor memory device according to an embodiment of the present invention.

FIG. 20 is a circuit diagram illustrating an example shift register of the shift register circuit 28 of a multi-time programmable semiconductor memory device according to an embodiment of the present invention. Any one of the shift registers SHIFT_REGISTER<0:127> may have a structure the same as the shift register illustrated in FIG. 20 except for the last shift register SHIFT REGISTER<127>.

When the load signal LOAD has logic "1", the external unit output signal UNIT_L<0> or the external unit full state signal Nth CELL_OUT_L<0> is stored in a first latch 201 via a transmission gate TG201 or a transmission gate TG202, respectively, based on the full state test signal FULL_TEST. When the clock signal CLK has logic "1", data in the first latch 201 is transmitted to a second latch 202.

When the load signal LOAD transitions to logic "0", a new register data input REGISTER_DIN<0> is stored in the first latch 201. The register data input REGISTER_DIN<0> is a register data output REGISTER_DOUT<1 > of the shift register SHIFT REGISTER<1>, and corresponds to the external unit output signal OUT_L<1> or the external full state signal Nth CELL_OUT_L<1>. In a similar manner, the data stored in the 128 shift registers SHIFT REGISTER<0: 127> are provided as the register data output REGISTER_DOUT<0>. The register data output REGISTER_DOUT<0> is outputted to the output data pad DOUT.

Figure 21:
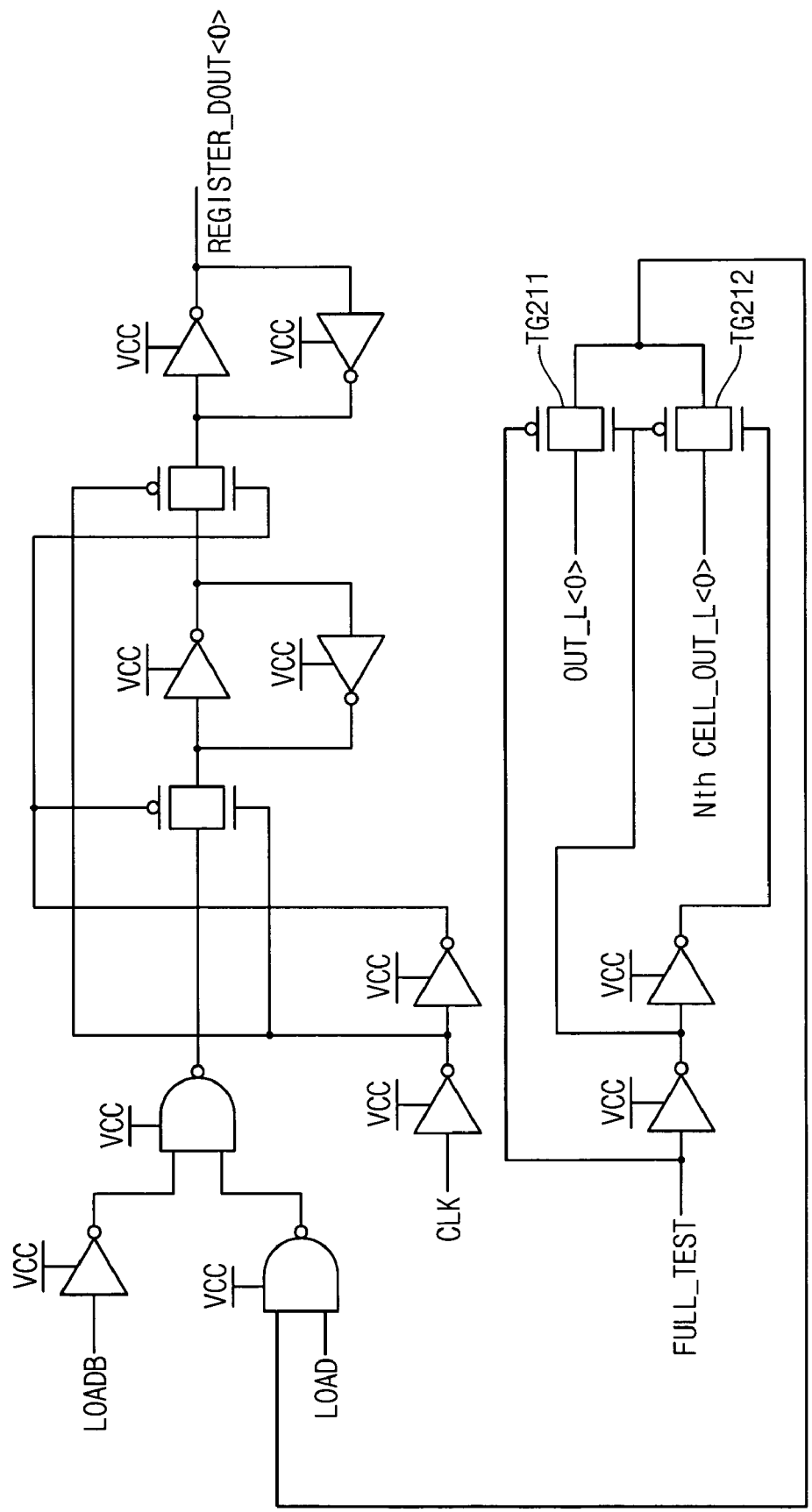
FIG. 21 is a circuit diagram illustrating a last shift register of a shift register circuit of a multi-time programmable semiconductor memory device according to an embodiment of the present invention.

FIG. 21 is a circuit diagram illustrating a last shift register of the shift register circuit 28 of a multi-time programmable semiconductor memory device according to an embodiment of the present invention. The last shift register may correspond to the last shift register SHIFT REGISTER<127> of the shift register circuit 28 in FIG. 19.

The shift register SHIFT REGISTER<127> is similar to the shift register SHIFT REGISTER<0> described with reference to FIG. 20 in form and function except that the shift register SHIFT REGISTER<127> does not receive an input from a previous shift register (for example, the register data input REGISTER_DIN<0> applied to the shift register SHIFT REGISTER<0> in FIG. 20). The reason for this is that data stored in the shift register SHIFT REGISTER<127> is outputted to an external device through the output data pad DOUT. The structure and function of the shift register SHIFT REGISTER<127> in FIG. 21 is similar to those already described in FIG. 20 and therefore, the description concerning the shift register SHIFT REGISTER<127> is omitted.

Figure 22A:
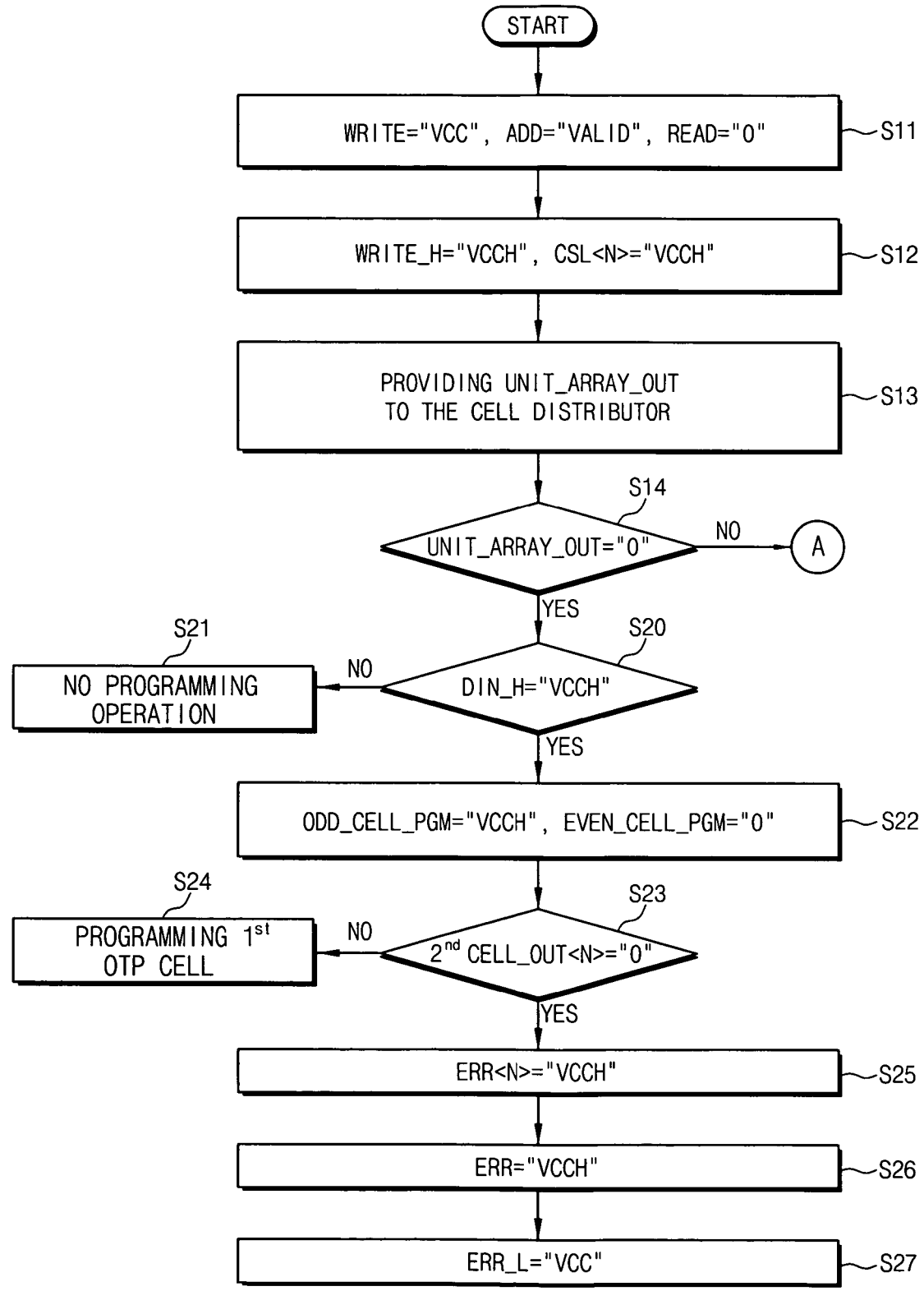
FIGS. 22A and 22B are flowchart diagrams illustrating a write operation of a multi-time programmable semiconductor memory device that may be programmed at least twice according to an embodiment of the present invention.
Figure 22B:
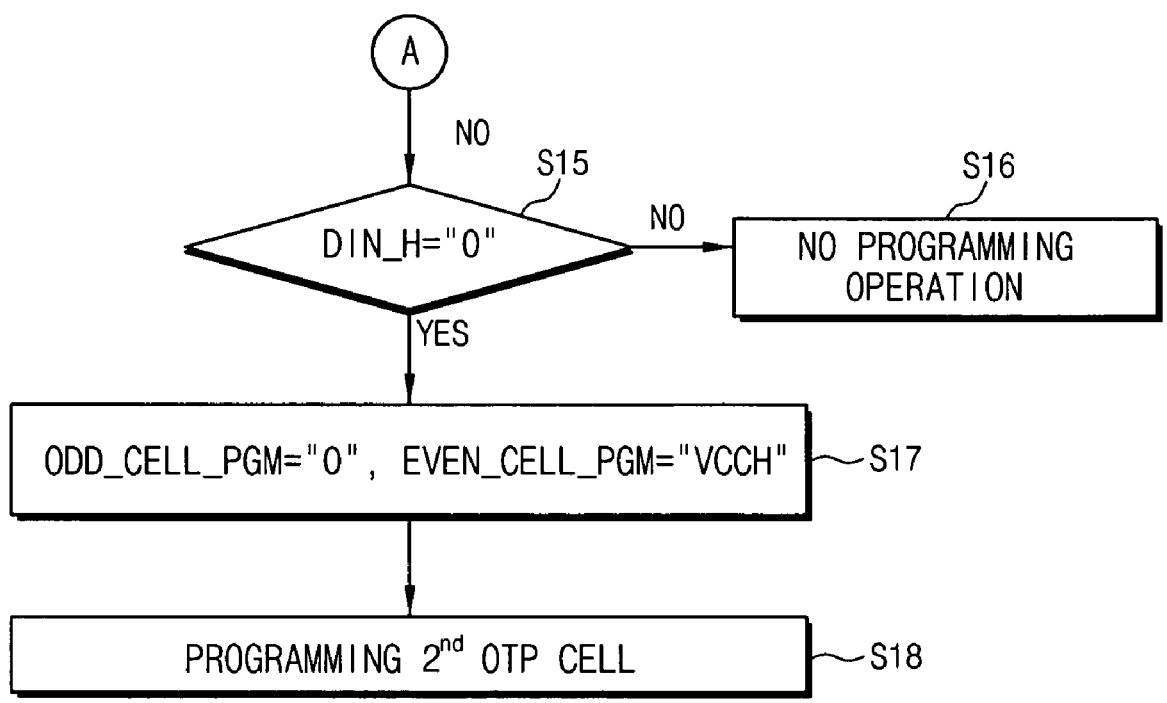

FIGS. 22A and 22B are flowchart diagrams illustrating a write operation of a multi-time programmable semiconductor memory device that may be programmed at least twice according to an embodiment of the present invention.

The flowchart diagrams in FIGS. 22A and 22B are for illustrating the write operation of the multi-time programmable semiconductor memory device that may be programmed at least twice using the programmable unit 80 having two OTP cells shown in FIG. 8.

When the write input signal WRITE having an active voltage level VCC and an appropriate address input signal ADD are inputted and the read input signal READ has a non-active state (e.g., logic "0"), the write operation for the multi-time programmable semiconductor memory device is performed (step S11).

The write input signal WRITE, the address input signal ADD, the read input signal READ are level shifted to internal signals by the level shifter 21 (step S12). In addition, the unit select signal CSL<N> for selecting one programmable unit of the unit array 24 is generated by the unit decoder 22 in response to the address input signal ADD (step S12).

By applying the unit select signal CSL<N> to the unit array 24 prior to the input of the write signal WRITE_H, the data transfer step is first performed while either the odd-numbered cell programming signal ODD_CELL_PGM or the even-numbered cell programming signal EVEN_CELL_PGM is not activated. The unit array output signal UNIT_ARRAY_OUT is outputted from the unit array 24 to the cell distributor 23 (step S13).

Next, the logic value of the unit array output signal UNIT_ARRAY_OUT is identified (step S14). When the unit array output signal UNIT_ARRAY_OUT has logic "1", namely data written in the programmable unit selected by the unit select signal CSL<N> has logic "1", the logic value of the data signal DIN_H is determined in step S15 described in FIG. 22B.

When it is determined that the input data DIN_H that is to be written in the selected programmable unit has logic "1" in step S15, the programming operation is not performed according to Table 1 (see fourth row) (step S16).

When it is determined that the input data DIN_H that is to be written in the selected programmable unit has logic "0", the odd-numbered cell programming signal ODD_CELL_PGM having logic "0" and the even-numbered cell programming signal EVEN_CELL_PGM having logic "1" are outputted by the distributor 23 (see third row of Table 1) (step S17). Based on the even-numbered cell programming signal EVEN_CELL_PGM having logic "1", the programming for OTP cell of the second OTP cell of the selected programmable unit is performed (step S18).

When the logic value of the unit array output signal UNIT_ARRAY_OUT is identified as logic "0" in step S14, determining the logic value of the data signal DIN_H is also performed in step S20.

When the logic value of the data signal DIN_H has logic "0", the programming operation is not performed according to Table 1 (see first row) (step S21). When the logic value of the data signal DIN_H has logic "1", the odd-numbered cell programming signal ODD_CELL_PGM having logic "1" is outputted and the even-numbered cell programming signal EVEN_CELL_PGM having logic "0" is outputted by the distributor 23 (see second row of Table 1) (step S22).

Next, whether the second OTP cell of the selected programmable unit is programmed or not is determined (step S23). If the second OTP cell is not programmed yet, the first OTP cell is programmed (step S24). If the second OTP cell is already programmed, the selected programmable unit has a full state so that the unit error state signal ERR<N> is activated (step S25).

In response to the activated unit error state signal ERR<N>, the error state signal ERR is activated by the error detector 26 (step S26). Next, the level down converter 27 levels down the error state signal ERR to output the external error state signal ERR_L (step S27).

Figure 23A:
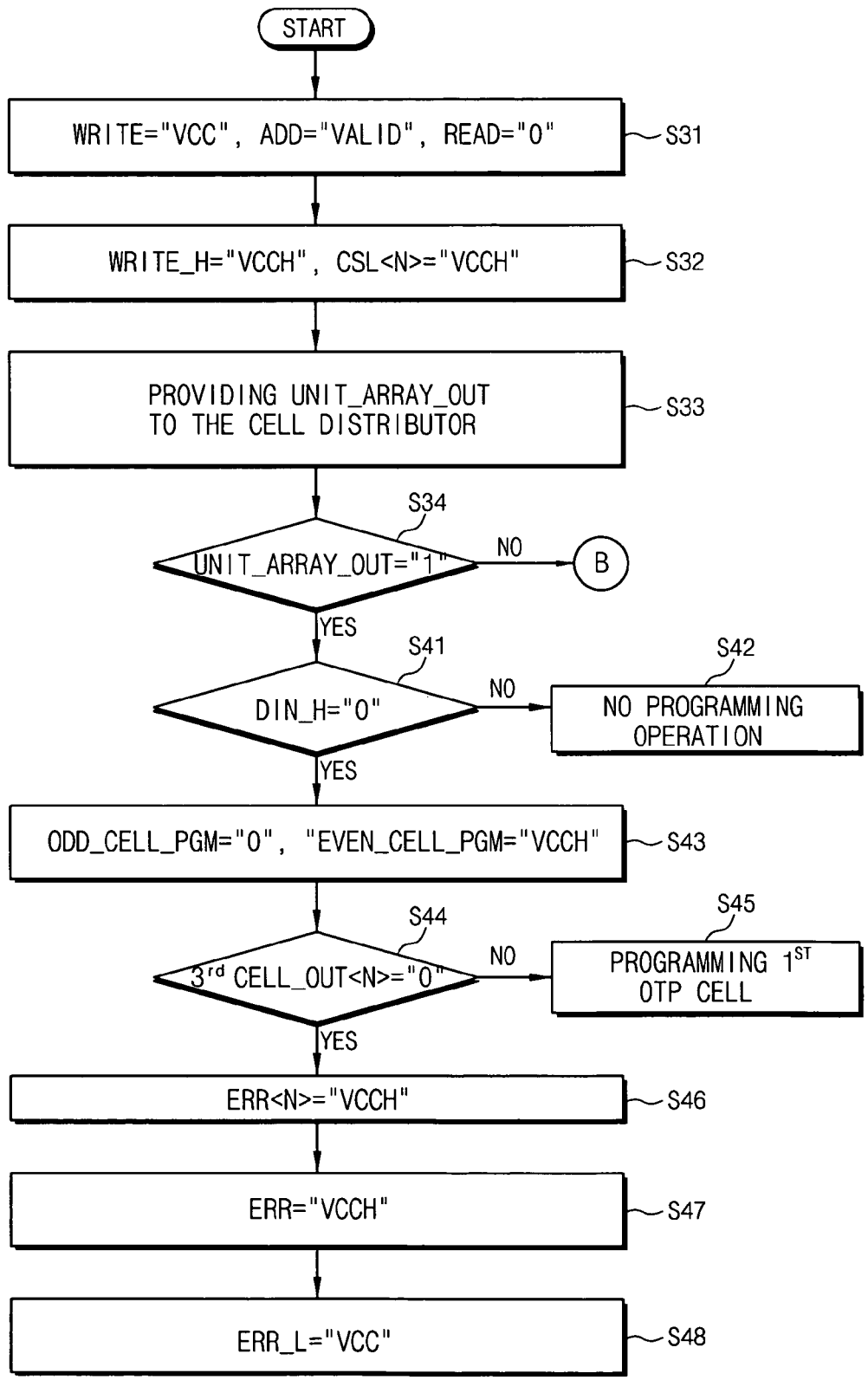
FIGS. 23A and 23B are flowchart diagrams illustrating a write operation of a multi-time programmable semiconductor memory device that may be programmed at least three times according to an embodiment of the present invention.
Figure 23B:
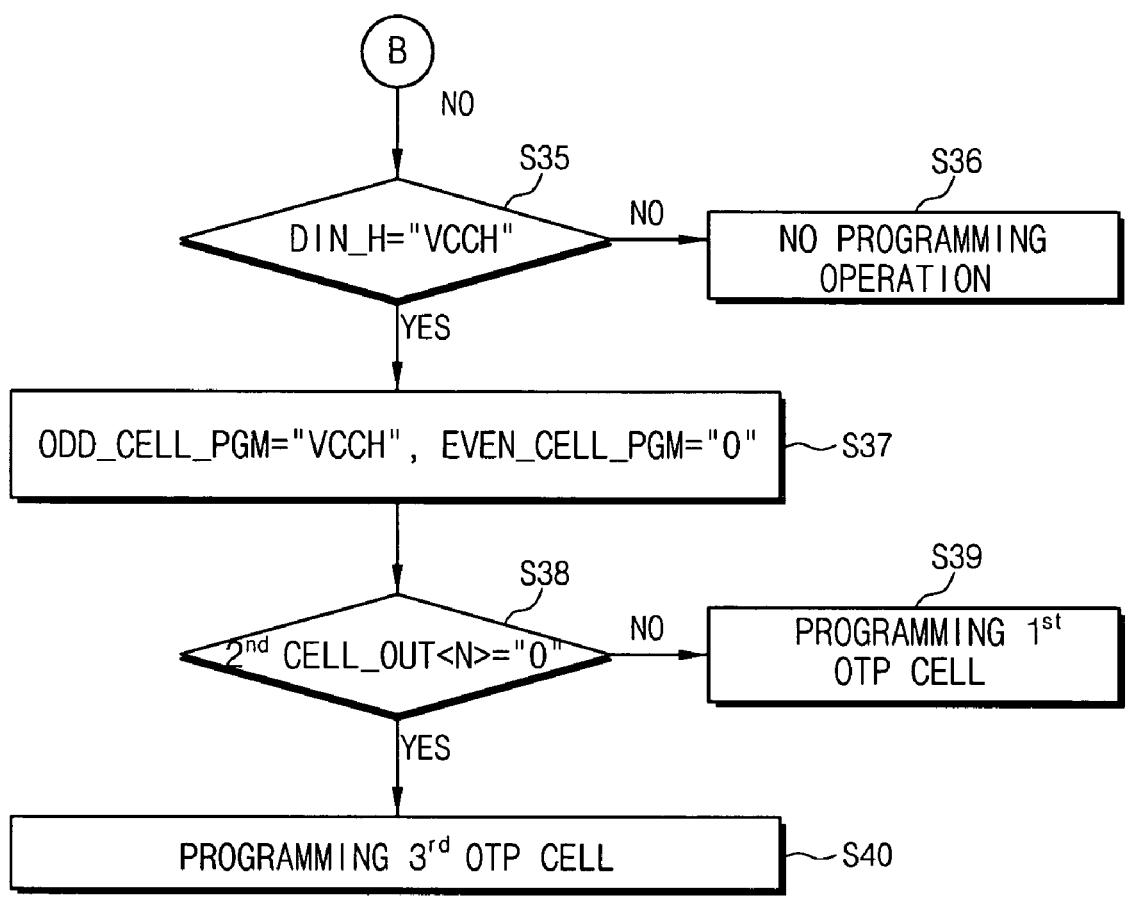

FIGS. 23A and 23B are flowchart diagrams illustrating a write operation of a multi-time programmable semiconductor memory device that may be programmed at least three times according to an embodiment of the present invention.

The flowchart diagrams in FIGS. 23A and 23B are for illustrating the write operation of the multi-time programmable semiconductor memory device that may be programmed at least three times using one of the programmable unit 90 and 100, each having three OTP cells shown in FIGS. 9 and 10.

When the write input signal WRITE having an active voltage level VCC and an appropriate address input signal ADD are inputted and the read input signal READ has a non-active state (e.g., logic "0"), the write operation for the multi-time programmable semiconductor memory device is performed (step S31).

The write input signal WRITE, the address input signal ADD, and the read input signal READ are level shifted to internal signals by the level shifter 21 (step S32). In addition, the unit select signal CSL<N> for selecting one programmable unit of the unit array 24 is generated by the unit decoder 22 in response to the address input signal ADD (also part of step S32).

By applying the unit select signal CSL<N> to the unit array 24 prior to the input of the write signal WRITE_H, the data transfer step is first performed while either the odd-numbered cell programming signal ODD_CELL_PGM or the even-numbered cell programming signal EVEN_CELL_PGM is not activated. The unit array output signal UNIT_ARRAY_OUT outputted from the programmable unit selected by the unit select signal CSL<N> is provided to the cell distributor 23 (step S33).

Next, the logic value of the unit array output signal UNIT_ARRAY_OUT is identified (step S34). When the unit array output signal UNIT_ARRAY_OUT has logic "0", namely data written in the programmable unit selected by the unit select signal CSL<N> has logic "0", the logic value of the data signal DIN_H is determined in step S35 described in FIG. 23B.

When it is determined that the input data DIN_H that is to be written in the selected programmable unit has logic "0" in step S35, the programming operation is not performed according to Table 1 (see first row of Table 1) (step S36).

When it is determined that the input data DIN_H that is to be written in the selected programmable unit has logic "1", the odd-numbered cell programming signal ODD_CELL_PGM having logic "1" and the even-numbered cell programming signal EVEN_CELL_PGM having logic "0" are outputted by the distributor 23 (see second row of Table 1) (step S37).

Next, whether the second OTP cell of the selected programmable unit is programmed or not is determined (step S38). If the second OTP cell is not programmed yet, the first OTP cell is programmed (step S39). When the second OTP cell is already programmed, the third OTP cell is programmed (step S40).

When the logic value of the unit array output signal UNIT_ARRAY_OUT is identified as logic "1" in step S34, determining the logic value of the data signal DIN_H is also performed in step S41.

When the logic value of the data signal DIN_H is identified as logic "1" in step S41, the programming operation is not performed according to Table 1 (see fourth row) (step S42). When the logic value of the data signal DIN_H that is to be written in the selected programmable unit has logic "0", the odd-numbered cell programming signal ODD_CELL_PGM having logic "0" and the even-numbered cell programming signal EVEN_CELL_PGM having logic "1" are outputted by the distributor 23 (see third row of Table 1) (step S43).

Next, whether the third OTP cell of the selected programmable unit is programmed or not is determined (step S44). If the third OTP cell is not programmed yet, the second OTP cell is programmed (step S45). If the third OTP cell is already programmed, the selected programmable unit has a full state so that the unit error state signal ERR<N> is activated (step S46).

In response to the activated unit error state signal ERR<N>, the error state signal ERR is activated by the error detector 26 (step S47). Next, the level down converter 27 levels down the error state signal ERR to output the external error state signal ERR_L (step S48).

FIGS. 24A through 24E are timing diagrams illustrating a write operation of a multi-time programmable semiconductor memory device that may be programmed at least twice according to an embodiment of the present invention.

The timing diagrams in FIGS. 24A through 24E are for illustrating the write operation performed on a first programmable unit and a second programmable unit of the unit array 24. For illustrative purposes, the first and second programmable units are assumed to store the same data and the write operations are performed in response to the same input data.

The write operation of the multi-time programmable semiconductor memory device that may be programmed at least twice using the programmable unit 80 having two OTP cells shown in FIG. 8 may be performed under five circumstances.

The first circumstance is where data stored in the programmable unit selected by the address signal ADD<0:6> has logic "0" and the input data signal DIN has logic "0". In this circumstance, the currently stored data is maintained so that the programming operation is not performed.

Figure 24A:
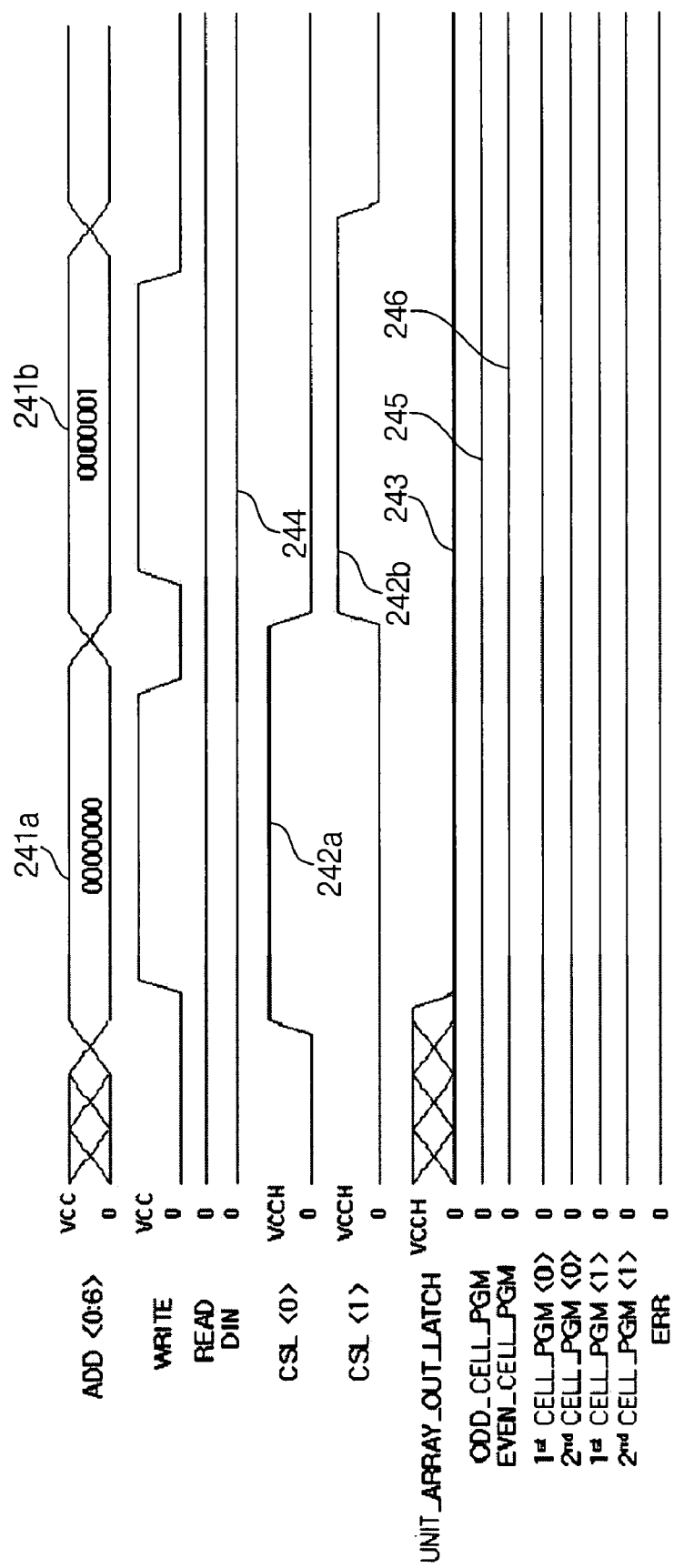

Referring to FIG. 24A, the address signal 241a for the first programmable unit and the address signal 241b for the second programmable unit are sequentially inputted to generate the unit select signal CSL<0> 242a and the unit select signal CSL<1> 242b in sequence.

The unit output signal of the first programmable unit and the unit output signal of the second programmable unit have all logic "0" (see 243 in FIG. 24A) and the data signal DIN has logic "0" (see 244 in FIG. 24A), thus being applicable to the first circumstance. Therefore, the odd-numbered cell programming signal ODD_CELL_PGM and the even-numbered cell programming signal EVEN_CELL_PGM have all non-active states 245 and 246, respectively.

The second circumstance is where the data stored in the programmable unit selected by the address signal ADD<0: 6> has logic "0" and the input data signal DIN has logic "1" and both the two OTP cells in the selected programmable unit are not programmed. In this circumstance, the first OTP cell of the corresponding programmable unit is programmed.

Figure 24B:
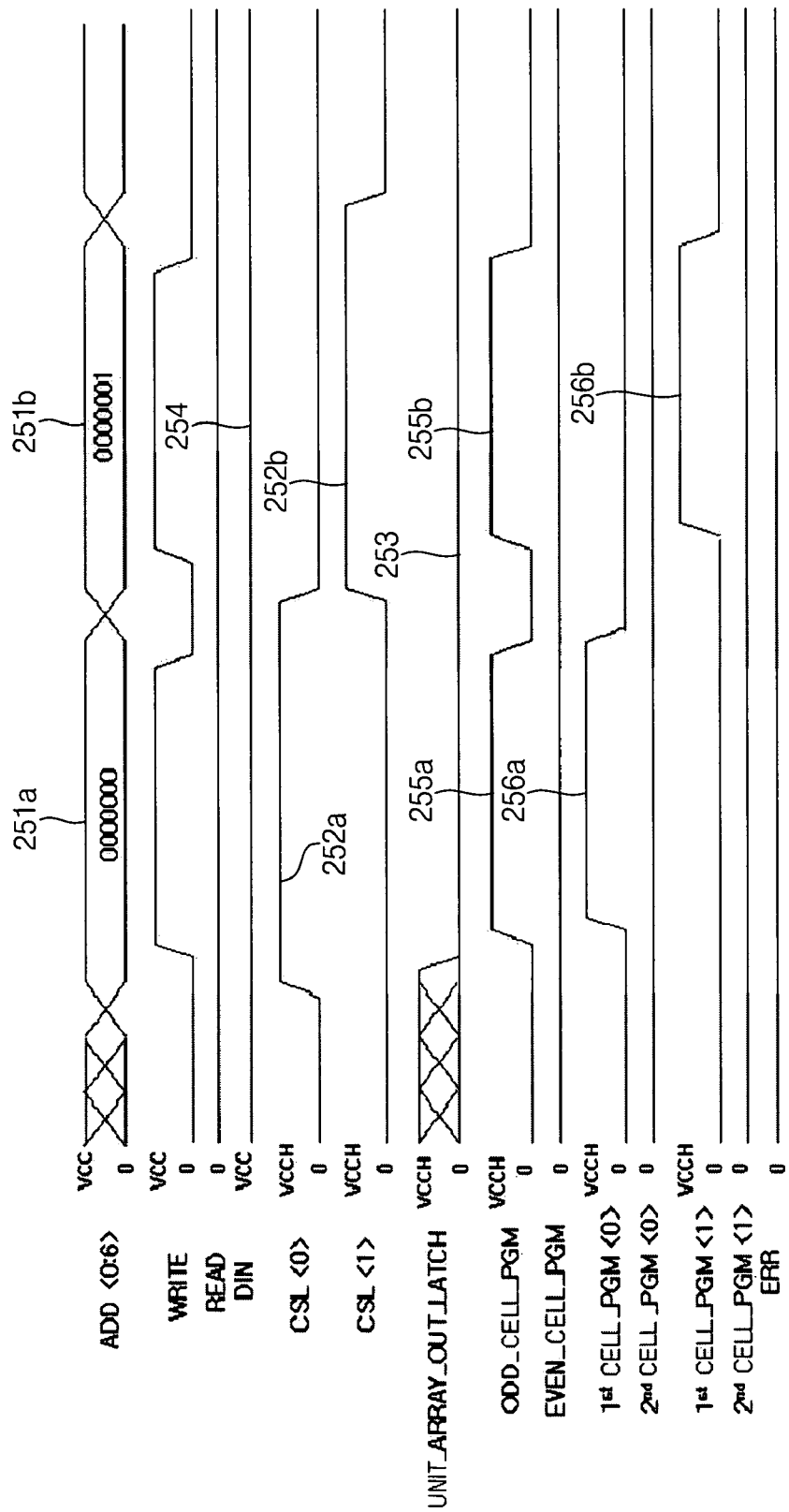

Referring to FIG. 24B, the address signal 251a for the first programmable unit and the address signal 251b for the second programmable unit are sequentially inputted to generate the unit select signal CSL<0> 252a and the unit select signal CSL<1> 252b in sequence.

The unit output signal of the first programmable unit and the unit output signal of the second programmable unit have all logic "0" (see 253 in FIG. 24B) and the data signal DIN has logic "1" (see 254 in FIG. 24B), thus being applicable to the second circumstance. Therefore, the odd-numbered cell programming signals ODD_CELL_PGM 255a and 255b for the respective programmable units are generated. In response to the odd-numbered cell programming signals ODD_CELL_PGM 255a and 255b, the first OTP cell programming signals 256a and 256b are generated.

The third circumstance is where the data stored in the programmable unit selected by the address signal ADD<0: 6> has logic "1" and the input data signal DIN has logic "1". In this circumstance, the data currently stored is maintained so that the programming operation is not performed, similar to the first circumstance.

Figure 24C:
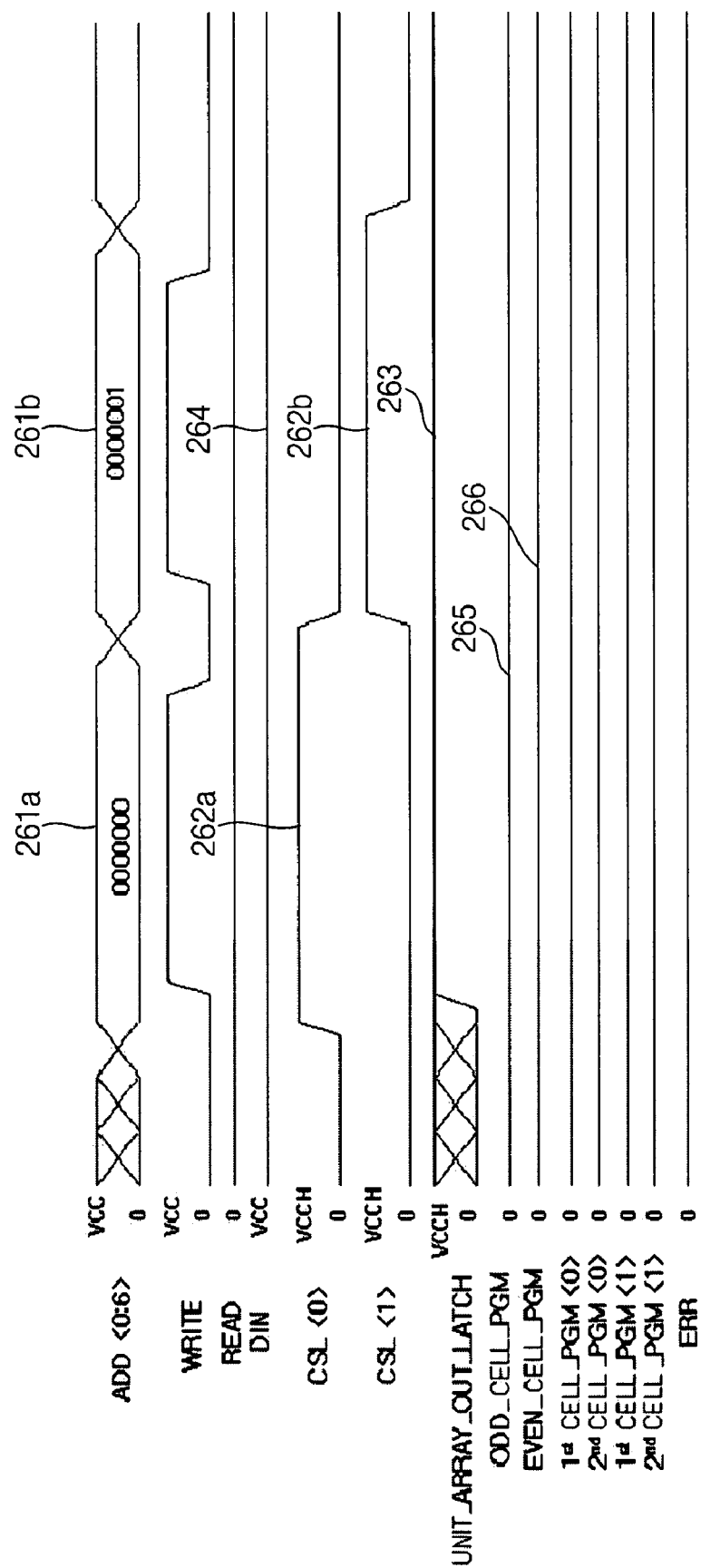

Referring to FIG. 24C, the address signal 261a for the first programmable unit and the address signal 261b for the second programmable unit are sequentially inputted to generate the unit select signal CSL<0> 262a and the unit select signal CSL<1> 262b in sequence.

The unit output signal of the first programmable unit and the unit output signal of the second programmable unit have all logic "1" (see 263 in FIG. 24C) and the data signal DIN has logic "1" (see 264 in FIG. 24C), thus being applicable to the third circumstance. Therefore, the odd-numbered cell programming signal ODD_CELL_PGM 265 and the even-numbered cell programming signal EVEN_CELL_PGM 266 are not activated.

The fourth circumstance is where the data stored in the programmable unit selected by the address signal ADD<0: 6> has logic "1" and the input data signal DIN has logic "0". In this circumstance, the second OTP cell of the corresponding programmable unit is programmed.

Figure 24D:
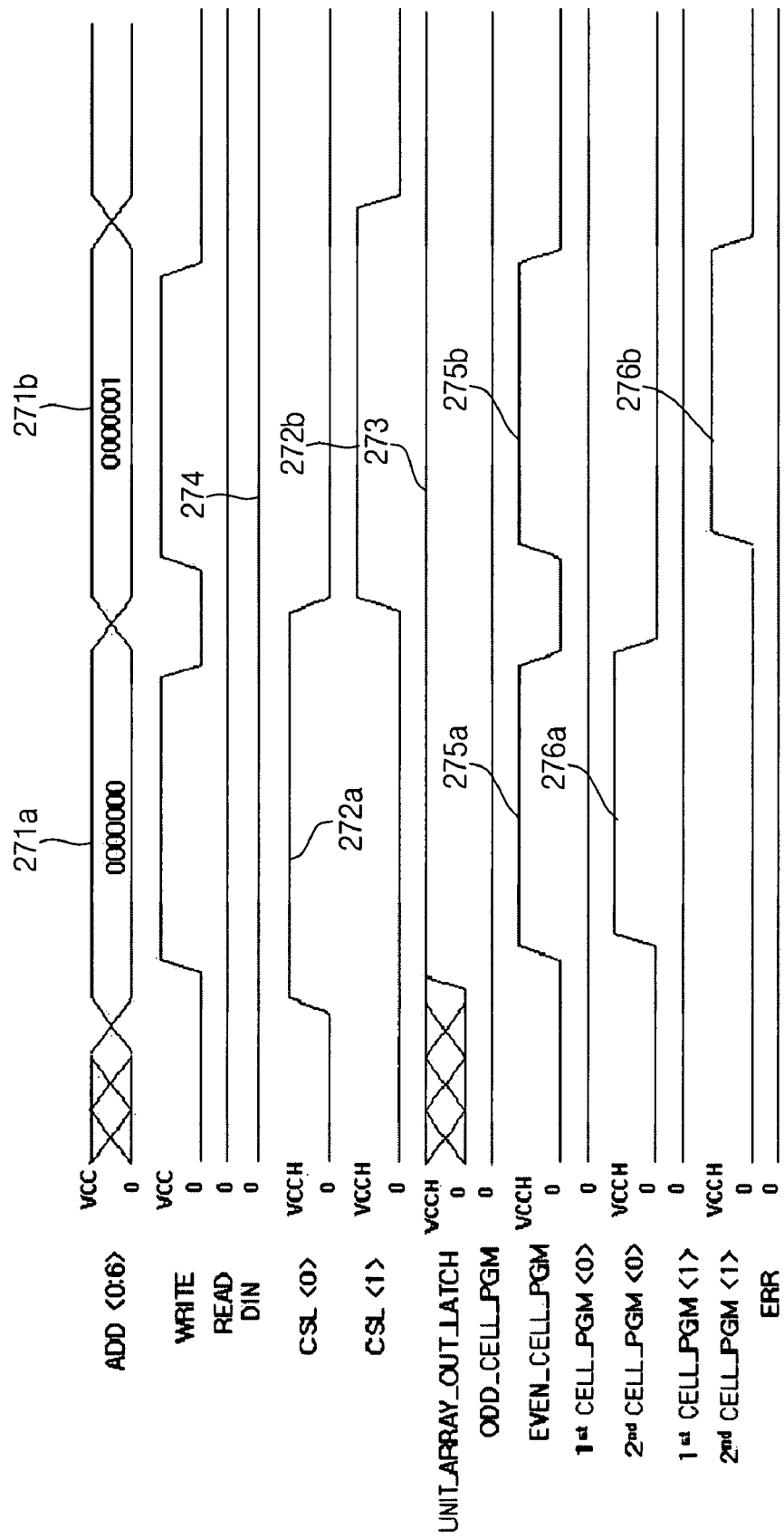

Referring to FIG. 24D, the address signal 271a for the first programmable unit and the address signal 271b for the second programmable unit are sequentially inputted to generate the unit select signal CSL<0> 272a and the unit select signal CSL<1> 272b in sequence.

The unit output signal of the first programmable unit and the unit output signal of the second programmable unit have all logic "1" (see 273 in FIG. 24D) and the data signal DIN has logic "0" (see 274 in FIG. 24D), thus being applicable to the fourth circumstance. Therefore, the even-numbered cell programming signals EVEN_CELL_PGM 275a and 275b for the respective programmable units are generated. In response to the even-numbered cell programming signals EVEN_CELL_PGM 275a and 275b, the second OTP cell programming signals 276a and 276b for the respective programmable units are generated.

The fifth circumstance is where the data stored in the programmable unit selected by the address signal ADD<0: 6> has logic "0" and the input data signal DIN has logic "1" and both the two OTP cells in the selected programmable unit are programmed. In this circumstance, the corresponding programmable unit has a full state so that trying to store data of opposite logic in the programmable unit may cause the generation of the error state signal ERR.

Referring to FIG. 24E, the address signal 281a for the first programmable unit and the address signal 281b for the second programmable unit are sequentially inputted to generate the unit select signal CSL<0> 282a and the unit select signal CSL<1> 282b in sequence.

The unit output signal of the first programmable unit and the unit output signal of the second programmable unit have all logic "0" (see 283 in FIG. 24E) and the data signal DIN has logic "1" (see 284 in FIG. 24E), thus being applicable to either the second or fifth circumstance. However, there is a difference in that the OTP cells in the programmable unit are all programmed compared to the second circumstance. First, as illustrated in FIG. 24E, the odd-numbered cell programming signals ODD_CELL_PGM 285a and 285b for the respective programmable units are generated. However, the programmable units that receive the odd-numbered cell programming signal ODD_CELL_PGM generate the unit error state signals ERR<0> and ERR<1> instead of programming the first OTP cell thereof. The error detector 26 generates the error state signals ERR 286a and 286b based on the unit error state signals ERR<0> and ERR<1>.

FIGS. 25A through 25F are timing diagrams illustrating a write operation of a multi-time programmable semiconductor memory device that may be programmed at least three times according to an embodiment of the present invention.

The timing diagrams in FIGS. 25A through 25F are for illustrating the write operation performed on the first programmable unit and the second programmable unit of the unit array 24. For illustrative purposes, the first and second programmable units are assumed to store the same data and the write operations are performed in response to the same input data.

The write operation of the multi-time programmable semiconductor memory device that may be programmed at least three times using the programmable unit 90 or 100 having three OTP cells shown in FIGS. 9 and 10 may be performed under six circumstances.

The first circumstance is where the data stored in the programmable unit selected by the address signal ADD<0: 6> has logic "0" and the input data signal DIN has logic "0". In this circumstance, the currently stored data is maintained so that the programming operation is not performed.

Figure 25A:
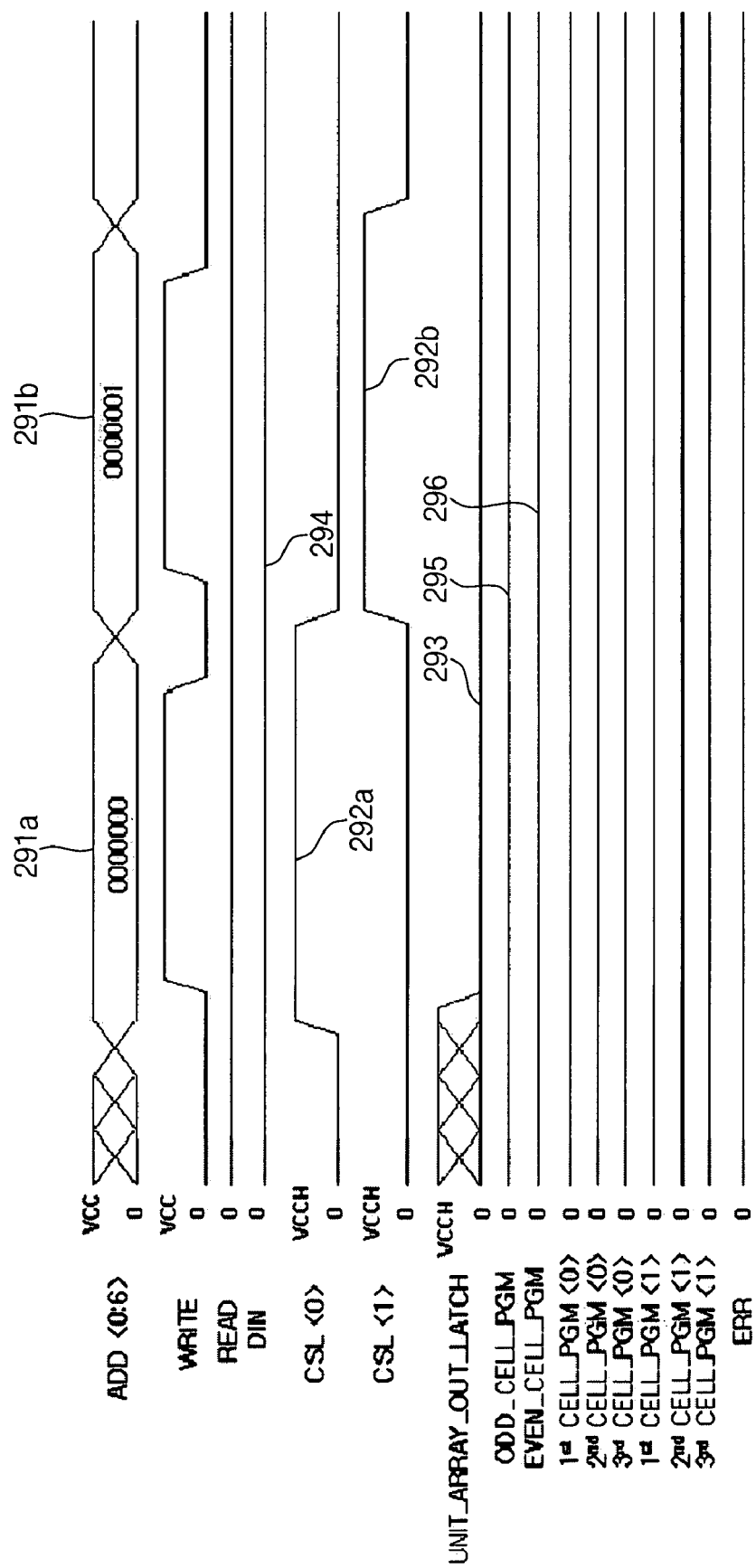
FIGS. 25A through 25F are timing diagrams illustrating a write operation of a multi-time programmable semiconductor memory device that may be programmed at least three times according to an embodiment of the present invention.

Referring to FIG. 25A, the address signal 291a for the first programmable unit and the address signal 291b for the second programmable unit are sequentially inputted to generate the unit select signal CSL<0> 292a and the unit select signal CSL<1> 292b in sequence.

The unit output signal of the first programmable unit and the unit output signal of the second programmable unit have all logic "0" (see 293 in FIG. 25A) and the data signal DIN has logic "0" (see 294 in FIG. 25A), thus being applicable to the first circumstance. Therefore, the odd-numbered cell programming signal ODD_CELL_PGM and the even-numbered cell programming signal EVEN_CELL_PGM have all non-active states 295 and 296.

The second circumstance is where the data stored in the programmable unit selected by the address signal ADD<0: 6> has logic "0" and the input data signal DIN has logic "1" and all the three OTP cells in the selected programmable unit are not programmed. In this circumstance, the first OTP cell of the corresponding programmable unit is programmed.

Figure 25B:
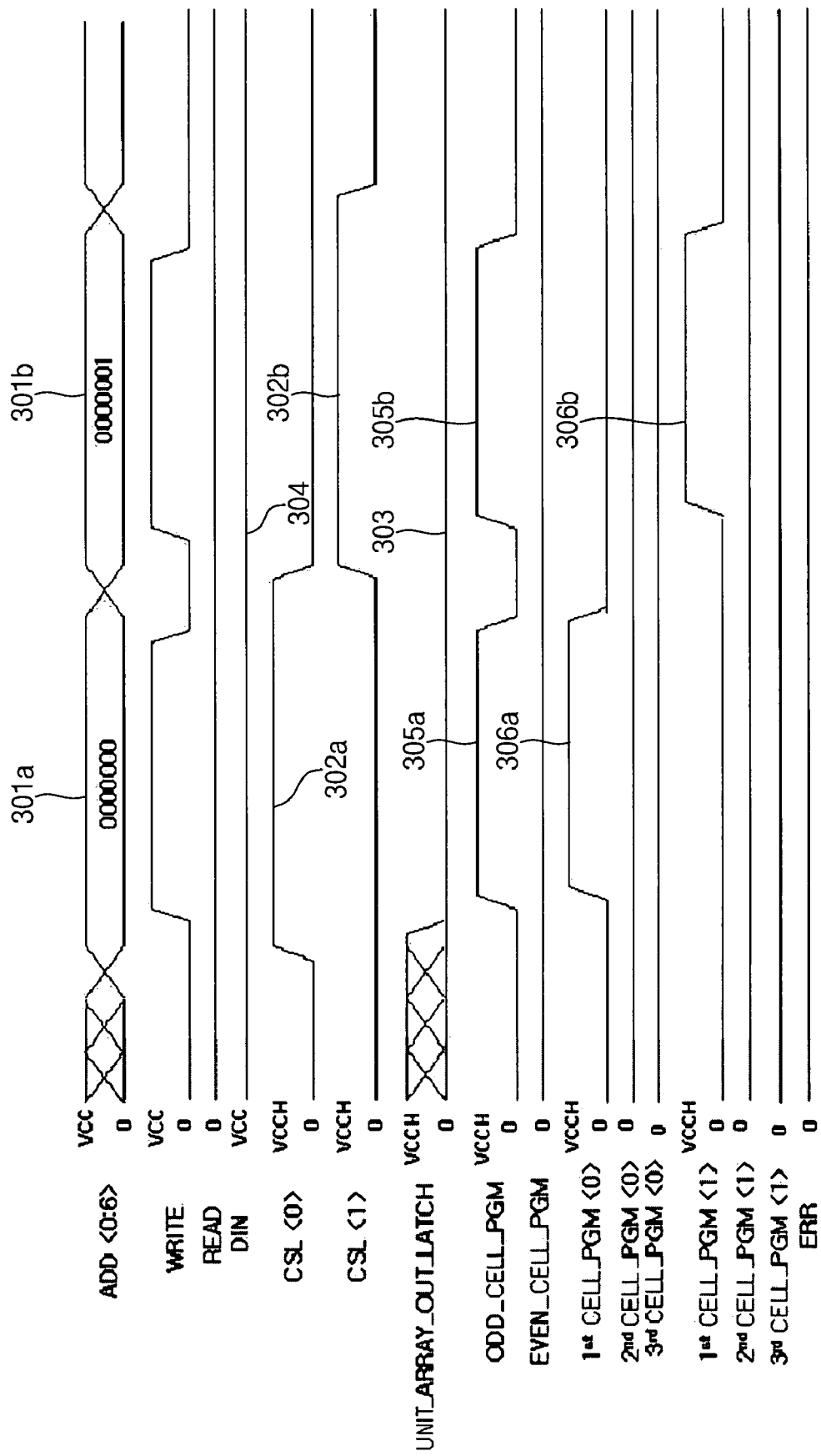

Referring to FIG. 25B, the address signal 301a for the first programmable unit and the address signal 301b for the second programmable unit are sequentially inputted to generate the unit select signal CSL<0> 302a and the unit select signal CSL<1> 302b in sequence.

The unit output signal of the first programmable unit and the unit output signal of the second programmable unit have all logic "0" (see 303 in FIG. 25B) and the data signal DIN has logic "1" (see 304 in FIG. 25B), thus being applicable to the second circumstance. Therefore, the odd-numbered cell programming signals ODD_CELL_PGM 305a and 305b for the respective programmable units are generated. In response to the odd-numbered cell programming signals ODD_CELL_PGM 305a and 305b, the first OTP cell programming signals 306a and 306b are generated.

The third circumstance is where the data stored in the programmable unit selected by the address signal ADD<0:6> has logic "1" and the input data signal DIN has logic "1". In this circumstance, the currently stored data is maintained so that the programming operation is not performed, similar to the first circumstance.

Figure 25C:
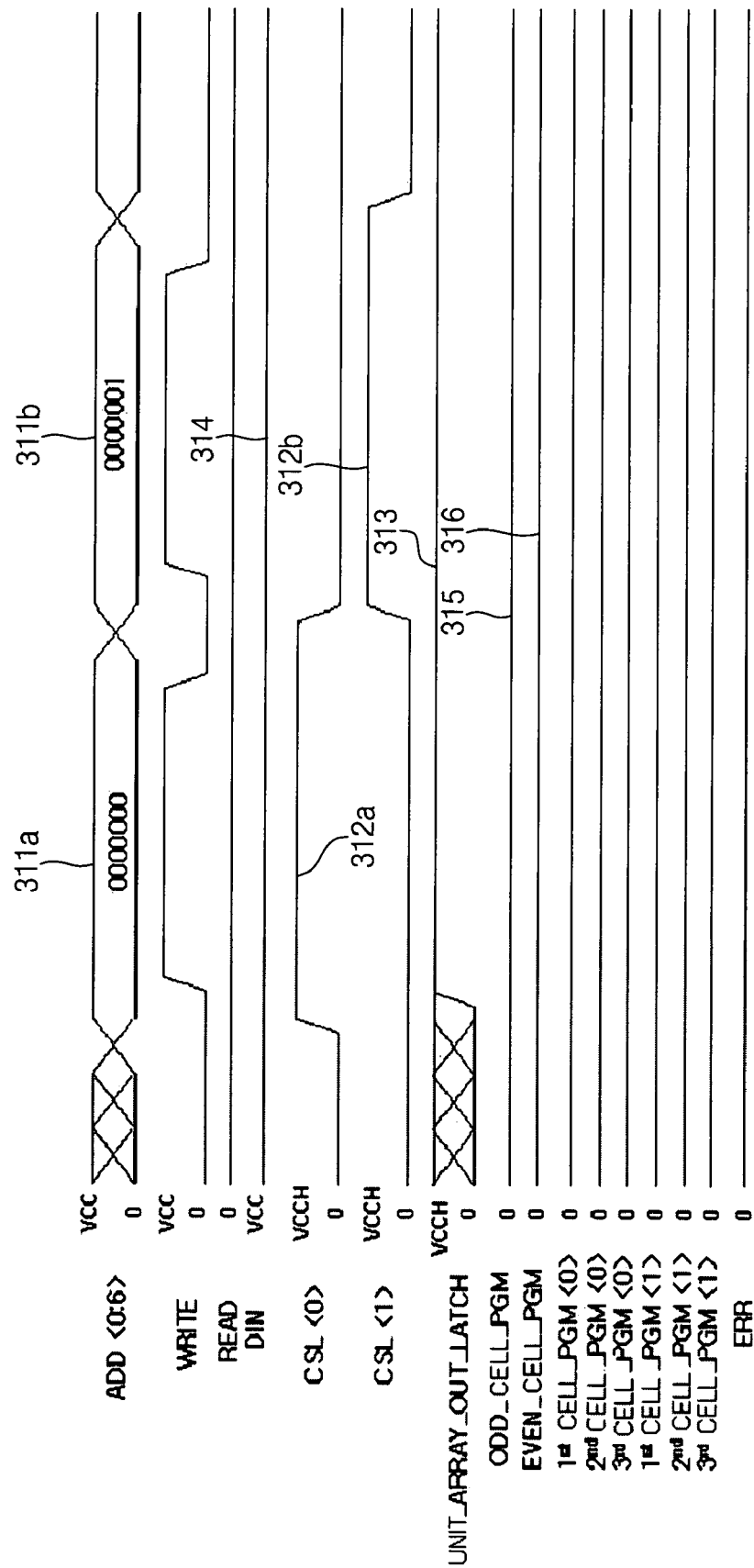

Referring to FIG. 25C, the address signal 311a for the first programmable unit and the address signal 311b for the second programmable unit are sequentially inputted to generate the unit select signal CSL<0> 312a and the unit select signal CSL<1> 312b in sequence.

The unit output signal of the first programmable unit and the unit output signal of the second programmable unit have all logic "1" (see 313 in FIG. 25C) and the data signal DIN has logic "1" (see 314 in FIG. 25C), thus being applicable to the third circumstance. Therefore, the odd-numbered cell programming signal ODD_CELL_PGM 315 and the even-numbered cell programming signal EVEN_CELL_PGM 316 are not activated.

The fourth circumstance is where the data stored in the programmable unit selected by the address signal ADD<0:6> has logic "1" and the input data signal DIN has logic "0" and the first OTP cell among the three OTP cells is programmed. In this circumstance, the second OTP cell of the corresponding programmable unit is programmed.

Figure 25D:
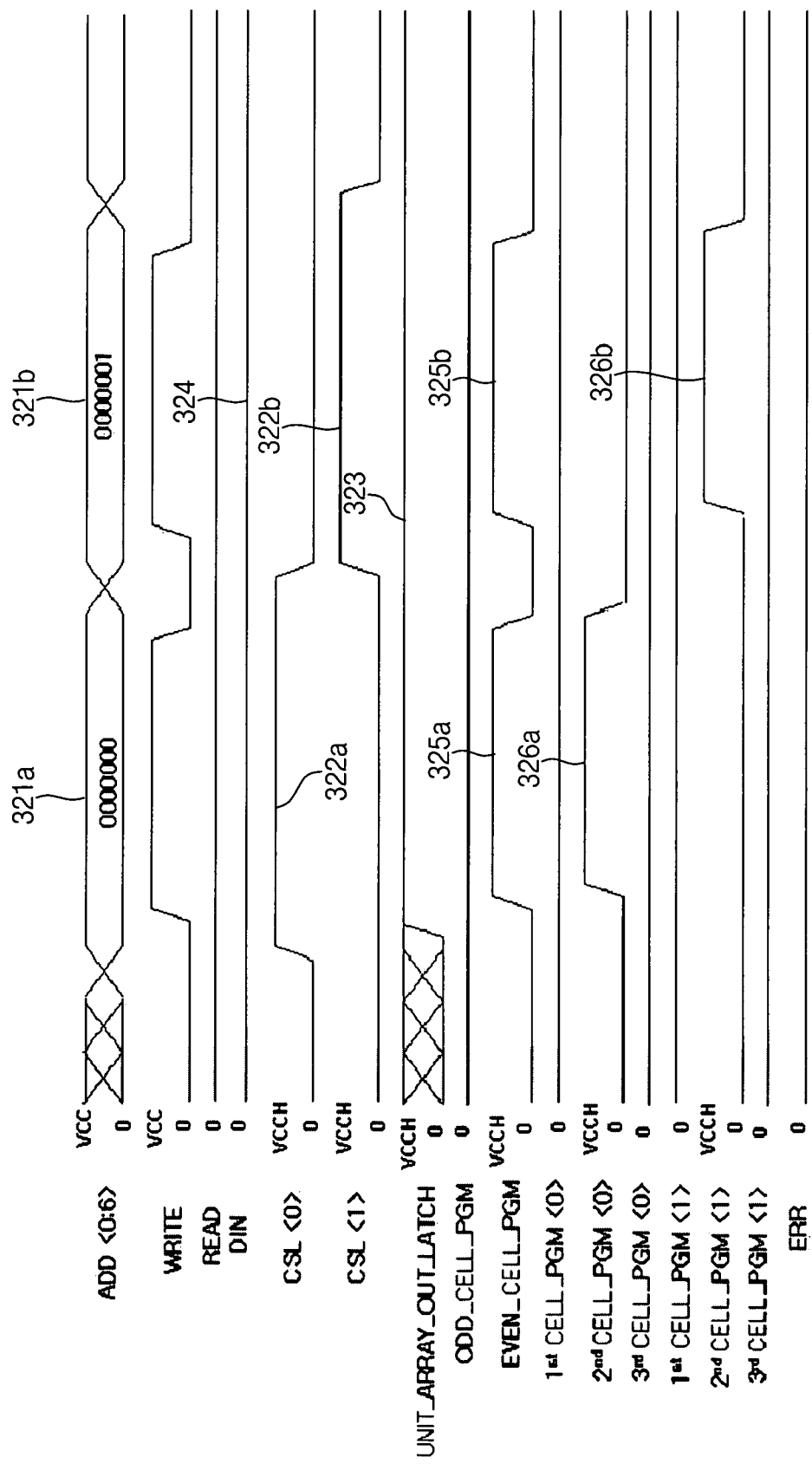

Referring to FIG. 25D, the address signal 321a for the first programmable unit and the address signal 321b for the second programmable unit are sequentially inputted to generate the unit select signal CSL<0> 322a and the unit select signal CSL<1> 322b in sequence.

The unit output signal of the first programmable unit and the unit output signal of the second programmable unit have all logic "1" (see 323 in FIG. 25D) and the data signal DIN has logic "0" (see 324 in FIG. 25D), thus being applicable to the fourth circumstance. Therefore, the even-numbered cell programming signals EVEN_CELL_PGM 325a and 325b for the respective programmable units are generated. In response to the even-numbered cell programming signals EVEN_CELL_PGM, the second OTP cell programming signals 326a and 326b for the respective programmable units are generated.

The fifth circumstance is where the data stored in the programmable unit selected by the address signal ADD<0:6> has logic "0" and the input data signal DIN has logic "1" and the first and second OTP cells among the three OTP cells in the selected programmable unit are programmed. The fifth circumstance is similar to the second circumstance of the write operation except that the first and second OTP cells are programmed in the third circumstance while all the three OTP cells in the selected programmable unit are not programmed in the second circumstance. Therefore, in the fifth circumstance, the third OTP cell is programmed.

Figure 25E:
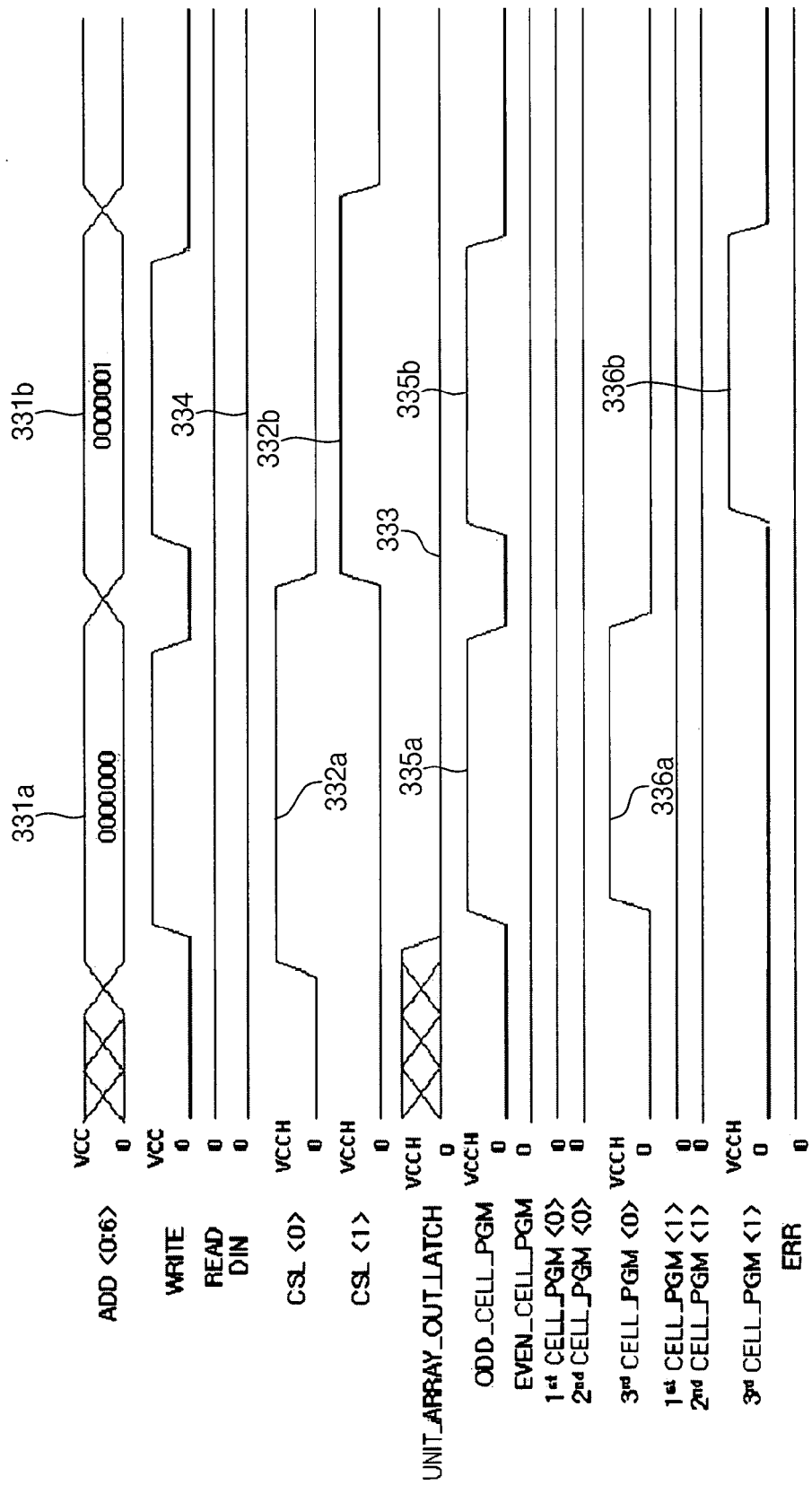

Referring to FIG. 25E, the address signal 331a for the first programmable unit and the address signal 331b for the second programmable unit are sequentially inputted to generate the unit select signal CSL<0> 332a and the unit select signal CSL<1> 332b in sequence.

The unit output signal of the first programmable unit and the unit output signal of the second programmable unit have all logic "0" (see 333 in FIG. 25E) and the data signal DIN has logic "1" (see 334 in FIG. 25E), thus being applicable to either the second or fifth circumstance. Therefore, the odd-numbered cell programming signals ODD_CELL_PGM 335a and 335b for the respective programmable units are generated. However, since the first and second OTP cells of the respective programmable units that receive the odd-numbered cell programming signal ODD_CELL_PGM are already programmed, the third OTP cell is programmed (see 336a and 336b in FIG. 25E).

The sixth circumstance is where the data stored in the programmable unit selected by the address signal ADD<0:6> has logic "1" and the input data signal DIN has logic "0" and all the three OTP cells in the selected programmable unit are programmed. In this circumstance, the corresponding programmable unit has a full state so that trying to store data of opposite logic in the programmable unit may cause the generation of the error state signal ERR.

Figure 25F:
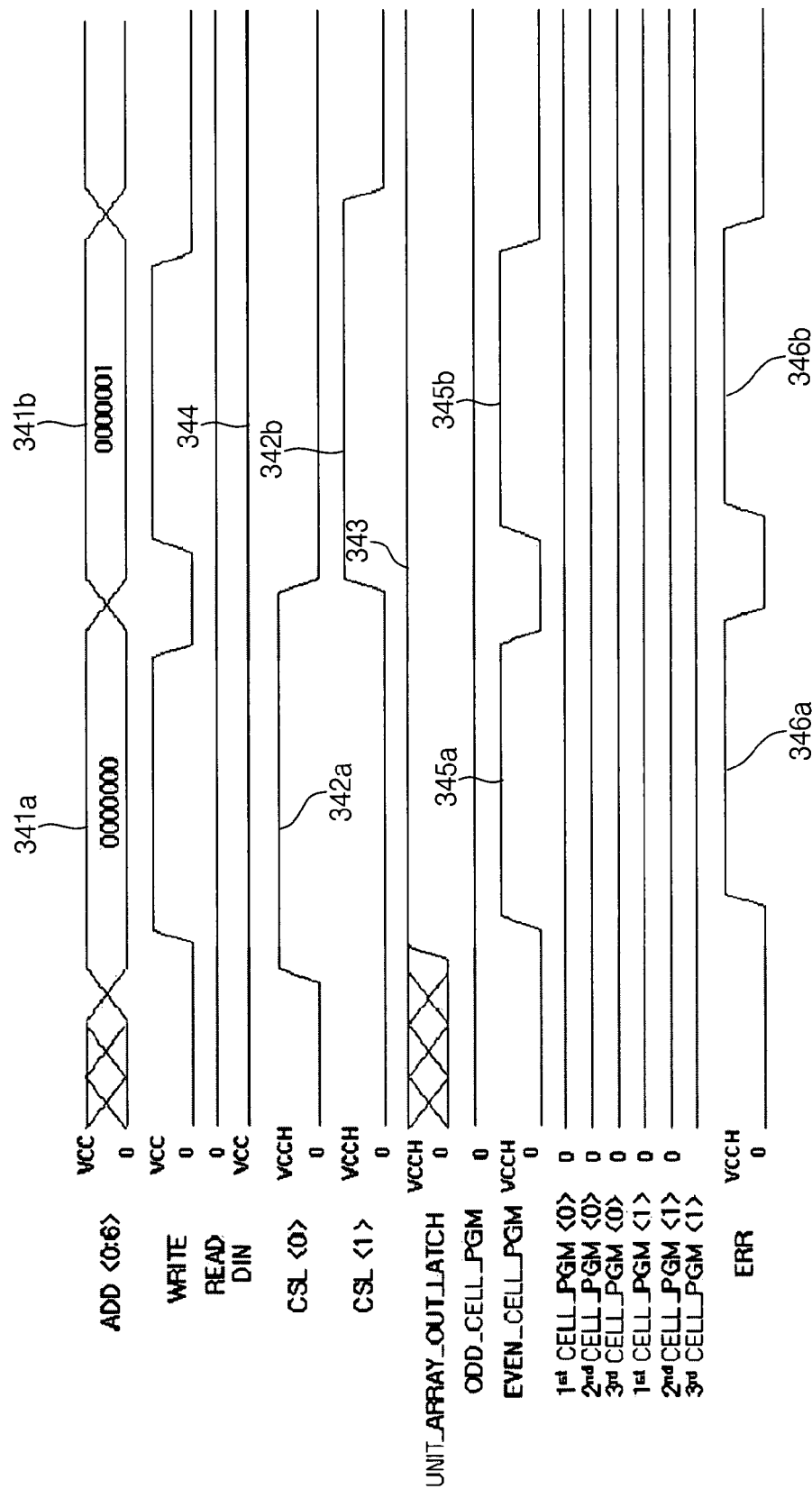

Referring to FIG. 25F, the address signal 341a for the first programmable unit and the address signal 341b for the second programmable unit are sequentially inputted to generate the unit select signal CSL<0> 342a and the unit select signal CSL<1> 342b in sequence.

The unit output signal of the first programmable unit and the unit output signal of the second programmable unit have all logic "1" (see 343 in FIG. 25F) and the data signal DIN has logic "0" (see 344 in FIG. 25F), thus being applicable to either the second or fourth circumstance. However, comparing with the second and fourth circumstances reveals a difference in that the OTP cells in the programmable unit are all programmed. First, as illustrated in FIGS. 25B and 25D, the odd-numbered cell programming signals ODD_CELL_PGM 345a and 345b for the respective programmable units are generated. However, the respective programmable units that receive the odd-numbered cell programming signal ODD_CELL_PGM generate the unit error state signals ERR<0> and ERR<1>. The error detector 26 generates the error state signals ERR 346a and 346b based on the unit error state signals ERR<0> and ERR<1>.

Figure 26:
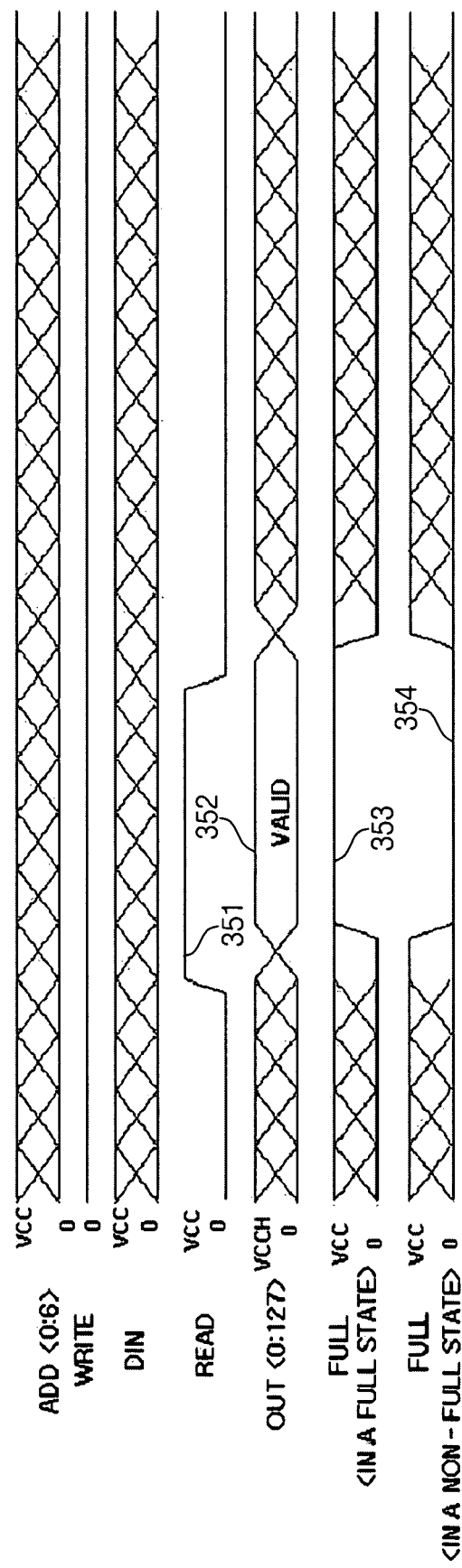
FIG. 26 is a timing diagram illustrating a read operation of a unit array of a multi-time programmable semiconductor memory device according to an embodiment of the present invention.

FIG. 26 is a timing diagram illustrating a read operation of a unit array of a multi-time programmable semiconductor memory device according to an embodiment of the present invention.

Referring to FIG. 26, when the read signal READ 351 is activated, the read operation of the unit array 24 of the multi-time programmable semiconductor memory device according to an embodiment of the present invention is performed.

The multi-time programmable semiconductor memory device 20 illustrated in FIG. 2 serially outputs data stored in the unit array 24 in sequence. Therefore, the address signal ADD and the input data signal DIN are ignored during the read operation.

After the read signal READ 351 is activated, the data stored in all the programmable units of the unit array are simultaneously outputted as the unit output signal OUT<0:127>.

The unit output signals OUT<0:127> 352 outputted from the respective programmable units are leveled down by the level down converter 27. In addition, the external unit output signal OUT_L<0:127> outputted from the level down converter 27 is serialized by the shift register circuit 28.

As the data stored in the respective programmable units of the unit array are outputted as the unit output signal OUT<0:127> 352, the full state of all the programmable units are provided as the unit full state signal Nth CELL_OUT<0:127>.

The full state detector 25 outputs the full state signal FULL based on the unit full state signal Nth CELL_OUT<0:127>. When at least one of all the programmable units in the unit array 24 has the full state, the full state signal FULL is activated (see 353 in FIG. 26). When none of the programmable units have the full state, the full state signal FULL is not activated (see 354 in FIG. 26).

In addition, although not illustrated in FIG. 26, in the read operation, the data stored in all of the programmable units of the unit array 24, the unit output signal OUT<0:127> 352 and the full state signal Nth CELL_OUT<0:127> of the respective programmable units may be simultaneously outputted as described above.

Similar to the unit output signal OUT<0:127> 352, the unit full state signal Nth CELL_OUT<0:127> is leveled down by the level down converter 27 and provided to the shift register circuit 28 as the external unit full state signal Nth CELL_OUT_L<0:127>.

The shift register circuit 28 receives the external unit full state signal Nth CELL_OUT_L<0:127> and the external unit output signal OUT<0:127> 352 and selectively serializes and outputs the external unit output signal OUT_L<0:127> or the external unit full state signal Nth CELL_OUT_L<0:127> based on the full state test signal FULL_TEST. The operation of the shift register circuit 28 according to the full state test signal FILL_TEST is described below with reference to FIGS. 27A and 27B.

Figure 27A:
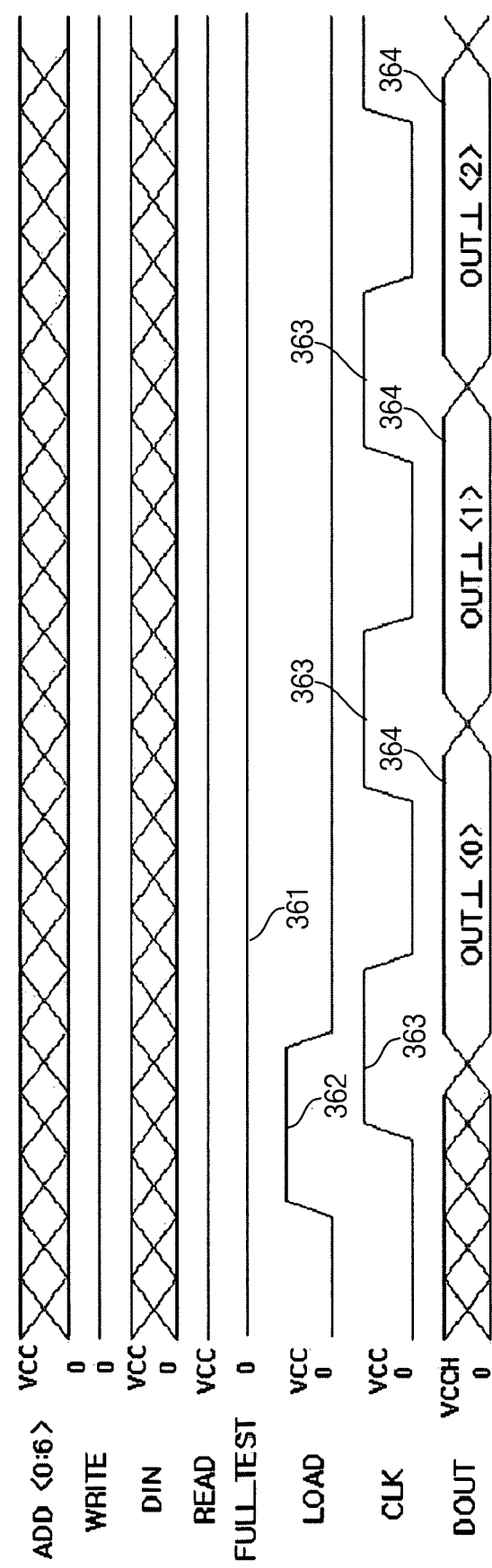
FIGS. 27A and 27B are timing diagrams illustrating an operation of a shift register circuit of a multi-time programmable semiconductor memory device according to an embodiment of the present invention.
Figure 27B:
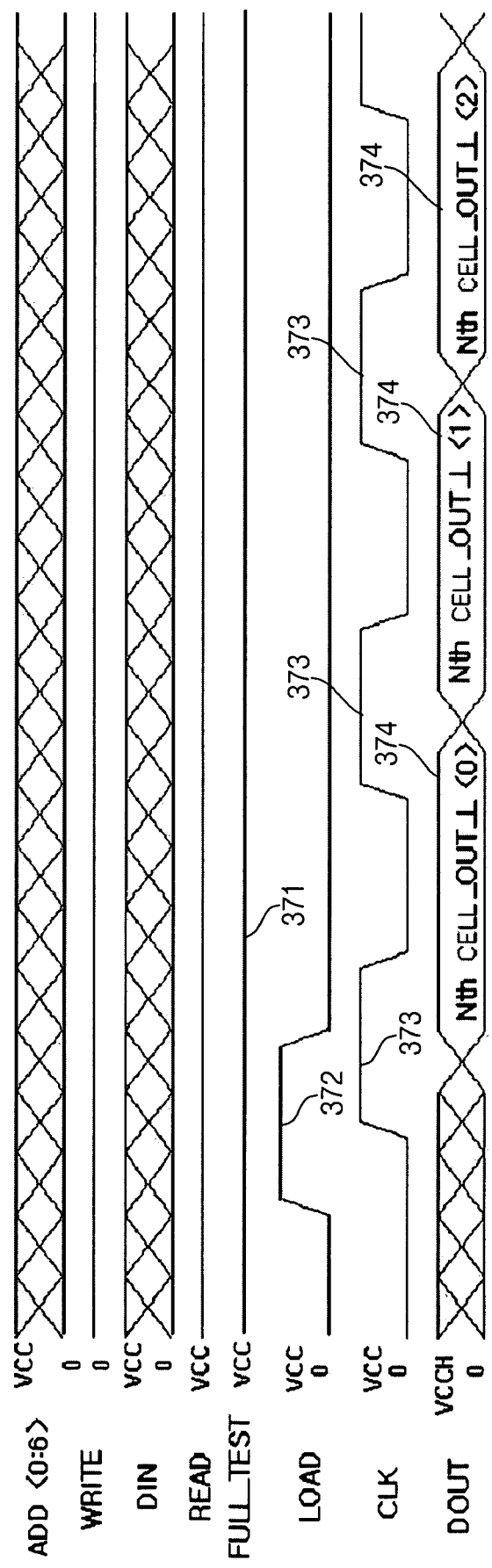

FIGS. 27A and 27B are timing diagrams illustrating an operation of a shift register circuit of a multi-time programmable semiconductor memory device according to an embodiment of the present invention.

Referring to FIGS. 27A and 27B, the address signal ADD and the input data signal DIN are ignored as during the read operation described above.

Referring to FIG. 27A, the full state test signal FULL_TEST is inactivated (see 361). The external unit output signals OUT_L<0:127> of the 128 programmable units are stored in 128 shift registers by the load signal LOAD 362. The data stored in the 128 shift registers are sequentially outputted through the output data pad DOUT while the clock signal CLK 363 is toggled by a predetermined amount (see 364).

Referring to FIG. 27B, the full state test signal FULL_TEST is activated (see 371). Therefore, the external unit full state signal Nth CELL_OUT_L<0:127> of the 128 programmable units are stored in 128 shift registers and the data stored in the 128 shift registers are sequentially outputted through the output data pad DOUT while the clock signal CLK 373 is toggled by a predetermined amount (see 374).

As described above, the multi-time programmable semiconductor memory device may be implemented using a one time programmable unit. Therefore, the multi-time programmable semiconductor memory device may be suitable for applications where data should be permanently preserved, as well as applications where multi-time programming is required. Also, logic compatibility and relatively low costs may be achieved.

Having thus described example embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A semiconductor memory device, comprising:
   a unit array including a plurality of programmable units each of which has a plurality of one-time programmable cells;
   a unit decoder configured to generate a unit select signal for selecting a programmable unit of the unit array based on an address signal; and
   a cell distribution circuit configured to generate an odd-numbered cell programming signal for programming an odd-numbered one-time programmable cell of the programmable unit that is selected by the unit select signal, and an even-numbered cell programming signal for programming an even-numbered one-time programmable cell of the programming unit, such generation being based on a first data state written in the selected programmable unit provided from the unit array and a second data state to be written to the selected programmable unit.

2. The semiconductor memory device of claim 1, wherein the cell distribution circuit generates the odd-numbered cell programming signal when the first data state written in the selected programmable unit has logic "0" and the second data state to be written to the selected programmable unit has logic "1".

3. The semiconductor memory device of claim 2, wherein a first odd-numbered one-time programmable cell of the selected programmable unit is programmed based on the odd-numbered cell programming signal.

4. The semiconductor memory device of claim 1, wherein the cell distribution circuit generates the even-numbered cell programming signal when the first data state written in the selected programmable unit has logic "1" and the second data state to be written to the selected programmable unit has logic "0".

5. The semiconductor memory device of claim 4, wherein a first even-numbered one-time programmable cell of the selected programmable unit is programmed based on the even-numbered cell programming signal.

6. The semiconductor memory device of claim 1, wherein the cell distribution circuit includes:
   a unit array output signal register configured to output the first data state written in the programmable unit selected by the unit select signal; and
   a cell programming signal generator configured to generate the odd-numbered cell programming signal and the even-numbered cell programming signal based on the first data state written in the selected programmable unit outputted from the unit array output signal register, the second data state to be written to the selected programmable unit, and a write signal.

7. The semiconductor memory device of claim 1, wherein the programmable unit includes:
   a plurality of one-time programmable cells; and
   a combinational logic circuit configured to output a data state of the programmable unit by a logical combination of programming states of the one-time programmable cells.

8. The semiconductor memory device of claim 7, wherein the combinational logic circuit outputs the data state of the programmable unit having logic "0" when none of the one-time programmable cells in the programmable unit are programmed or an even number of the one-time programmable cells of the programmable unit are programmed, and outputs the data state of the programmable unit having logic "1" when an odd number of the one-time programmable cells of the programmable unit are programmed.

9. The semiconductor memory device of claim 8, wherein the combinational logic circuit includes at least one XOR gate.

10. The semiconductor memory device of claim 8, wherein the combinational logic circuit includes at least one inverter.

11. The semiconductor memory device of claim 7, wherein the one-time programmable cell is implemented using an electrical fuse.

12. The semiconductor memory device of claim 7, wherein the one-time programmable cell is implemented using an anti-fuse.

13. The semiconductor memory device of claim 1, wherein the programmable unit activates a unit error state signal when the first data state written in the programmable unit is different from the second data state to be written to the programmable unit and all of the one-time programmable cells of the programmable unit are programmed.

14. The semiconductor memory device of claim 13, further comprising an error state detector configured to generate an error state signal when at least one of the unit error state signals of the programmable units of the unit array is activated.

15. The semiconductor memory device of claim 1, wherein the programmable unit activates a unit full state signal when all the one-time programmable cells of the programmable unit are programmed.

16. The semiconductor memory device of claim 15, wherein a programming state of a last one-time programmable cell of the programmable unit is provided as the unit full state signal.

17. The semiconductor memory device of claim 15, further comprising a full state detector configured to generate a full state signal when at least one of the unit full state signals of all the programmable units of the unit array is activated.

18. The semiconductor memory device of claim 1, further comprising a level shifter circuit configured to generate a level-shifted address signal, a level-shifted write signal, and a level-shifted read signal based on an address input signal, a write input signal, and a read input signal, respectively.

19. A method of programming of a semiconductor memory device, comprising:
  receiving an input data signal and an address signal;
  selecting a programmable unit to which the input data signal is written in response to the address signal;
  outputting a data state stored in the selected programmable unit;
  generating an odd-numbered cell programming signal when the data state stored in the selected programmable unit has a first logic state and the input data signal has a second logic state;
  generating an even-numbered cell programming signal when the data state stored in the selected programmable unit has the second logic state and the input data signal has the first logic state;
  programming a first odd-numbered one-time programmable cell that is not programmed among the programmable cells of the selected programmable unit, based on the odd-numbered cell programming signal; and
  programming a first even-numbered one-time programmable cell that is not programmed among the programmable cells of the selected programmable unit, based on the even-numbered cell programming signal.

20. The method of claim 19, wherein the outputting of the data state stored in the selected programmable unit includes outputting a logical combination of respective programming states of the one-time programmable cells of the programmable unit as the data state stored in the selected programmable unit.

21. The method of claim 20, wherein the outputting of the data state stored in the selected programmable unit includes,
  outputting the data state stored in the selected programmable unit having a logic "0" when all the one-time programmable cells of the programmable unit are not programmed or an even number of the one time programmable cells of the programmable unit are programmed; and
  outputting the data state stored in the selected programmable unit having a logic "1" when an odd number of the one time programmable cells of the programmable unit are programmed.

22. The method of claim 19, further comprising outputting a unit full state signal, which indicates that all the one-time programmable cells of the programmable unit are programmed when all the one-time programmable cells of the programmable unit are programmed.

23. The method of claim 22, wherein the outputting the unit full state signal includes outputting a programming state of a last one-time programmable cell of the programmable unit as the unit full state signal.

24. The method of claim 19, further comprising outputting a unit error state signal, which indicates that any additional programming is not permissible when the data state written in the programmable unit is different from the data state to be written to the programmable unit and all the one-time programmable cells of the programmable unit are programmed.

25. A semiconductor memory device comprising:
  a unit array including a plurality of programmable units, each programmable unit including a plurality of one-time programmable cells;
  a unit decoder configured to select a programmable unit of the unit array in response to an address signal; and
  a cell distribution circuit configured to program one of an odd-numbered one-time programmable cell of the selected programmable unit and an even-numbered one-time programmable cell of the selected programming unit, in response to a previous data state of the selected programmable unit and a present data state to be programmed on the selected programmable unit.

26. The semiconductor memory device of claim 25, wherein the cell distribution circuit generates the odd-numbered cell programming signal when the previous data state of the selected programmable unit has logic "0" and the present data state to be programmed to the selected programmable unit has logic "1".

27. The semiconductor memory device of claim 25, wherein the cell distribution circuit generates the even-numbered cell programming signal when the previous data state of the selected programmable unit has logic "1" and the present data state to be programmed to the selected programmable unit has logic "0".

28. The semiconductor memory device of claim 25, wherein the cell distribution circuit includes:
  a unit array output signal register configured to output the previous data state of the programmable unit selected by the unit select signal; and a cell programming signal generator configured to generate the odd-numbered cell programming signal and the even-numbered cell programming signal based on the previous data state of the selected programmable unit, the present data state to be programmed to the selected programmable unit, and a write signal.

29. The semiconductor memory device of claim 25, wherein the programmable unit includes:
a plurality of one-time programmable cells; and
a combinational logic circuit configured to output a data state of the programmable unit by a logical combination of programming states of the one-time programmable cells.

30. The semiconductor memory device of claim 25, wherein the combinational logic circuit outputs the data state of the programmable unit having logic "0" when none of the one-time programmable cells in the programmable unit are programmed or an even number of the one-time programmable cells of the programmable unit are programmed, and outputs the data state of the programmable unit having logic "1" when an odd number of the one-time programmable cells of the programmable unit are programmed.

31. The semiconductor memory device of claim 25, wherein the programmable unit activates a unit error state signal when the previous data state of the programmable unit is different from the present data state to be programmed to the programmable unit and all of the one-time programmable cells of the programmable unit are programmed.

32. The semiconductor memory device of claim 31, further comprising an error state detector configured to generate an error state signal when at least one of the unit error state signals of the programmable units of the unit array is activated.

33. The semiconductor memory device of claim 25, wherein the programmable unit activates a unit full state signal when all the one-time programmable cells of the programmable unit are programmed.

34. The semiconductor memory device of claim 25, further comprising a level shifter circuit configured to generate a level-shifted address signal, a level-shifted write signal, and a level-shifted read signal based on an address input signal, a write input signal, and a read input signal, respectively.

* * * * *

UNITED STATES PATENT AND TRADEMARK OFFICE
CERTIFICATE OF CORRECTION

PATENT NO. : 7,227,802 B2 Page 1 of 1
APPLICATION NO. : 11/316421
DATED : June 5, 2007
INVENTOR(S) : Jong-Hoon Jung et al.

It is certified that error appears in the above-identified patent and that said Letters Patent is hereby corrected as shown below:

Column 14, lines 5 and 6, the words "controller 1 13" should read -- controller 113 --.

Signed and Sealed this

Fifth Day of August, 2008

JON W. DUDAS
*Director of the United States Patent and Trademark Office*